(12) United States Patent
Willard

(10) Patent No.: US 11,601,126 B2
(45) Date of Patent: Mar. 7, 2023

(54) RF SWITCH STACK WITH CHARGE REDISTRIBUTION

(71) Applicant: pSemi Corporation, San Diego, CA (US)

(72) Inventor: Simon Edward Willard, Irvine, CA (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 17/119,840

(22) Filed: Dec. 11, 2020

(65) Prior Publication Data

US 2022/0190826 A1 Jun. 16, 2022

(51) Int. Cl.
*H04B 1/48* (2006.01)
*H03K 17/687* (2006.01)
*H03H 11/02* (2006.01)
*H04B 1/44* (2006.01)

(52) U.S. Cl.
CPC ......... *H03K 17/6874* (2013.01); *H03H 11/02* (2013.01); *H04B 1/44* (2013.01); *H04B 1/48* (2013.01)

(58) Field of Classification Search
CPC .... H03K 17/6874; H03K 17/693; H04B 1/48; H04B 1/44; H03H 11/02
See application file for complete search history.

(56) References Cited

U.S. PATENT DOCUMENTS

| | | | |
|---|---|---|---|
| 10,044,349 B2 | 8/2018 | Scott et al. | |
| 10,236,872 B1 | 3/2019 | Willard | |
| 10,680,599 B1 | 6/2020 | Syroiezhin et al. | |
| 10,715,133 B1 | 7/2020 | Scott et al. | |
| 2008/0129642 A1 | 6/2008 | Ahn et al. | |
| 2011/0260774 A1 | 10/2011 | Granger-Jones et al. | |
| 2014/0118053 A1 | 5/2014 | Matsuno | |
| 2015/0171860 A1 | 6/2015 | Blin | |
| 2015/0341026 A1* | 11/2015 | de Jongh | H03K 17/161 327/382 |
| 2016/0085256 A1 | 3/2016 | Cam et al. | |
| 2019/0245533 A1 | 8/2019 | Schleicher et al. | |
| 2019/0305768 A1 | 10/2019 | Willard et al. | |
| 2019/0305769 A1 | 10/2019 | Willard et al. | |

(Continued)

FOREIGN PATENT DOCUMENTS

| | | |
|---|---|---|
| CN | 113810034 A | 12/2021 |
| CN | 114629479 A | 6/2022 |

(Continued)

OTHER PUBLICATIONS

Non-Final Office Action for U.S. Appl. No. 16/902,032, filed Jun. 15, 2020 on behalf of Psemi Corporation. dated Jan. 8, 2021. 15 Pages.

(Continued)

*Primary Examiner* — Jung Kim
(74) *Attorney, Agent, or Firm* — Steinfl + Bruno LLP

(57) ABSTRACT

Methods and devices to address body leakage current generation and bias voltage distribution associated with body leakage current in an OFF state of a FET switch stack are disclosed. The devices include charge redistribution arrangements and bridge networks to perform coupling/decoupling to/from the FET switch stack. Detailed structures of such bridge networks are also described.

21 Claims, 25 Drawing Sheets

(56) References Cited

U.S. PATENT DOCUMENTS

| | | |
|---|---|---|
| 2020/0119731 A1 | 4/2020 | Teggatz et al. |
| 2020/0382114 A1 | 12/2020 | Scott et al. |
| 2021/0391858 A1 | 12/2021 | Shapiro et al. |
| 2022/0038092 A1 | 2/2022 | Genc |
| 2022/0038097 A1 | 2/2022 | Genc et al. |
| 2022/0038099 A1 | 2/2022 | Genc |

FOREIGN PATENT DOCUMENTS

| | | |
|---|---|---|
| JP | 2010010728 A | 1/2010 |
| KR | 100916472 B1 | 9/2009 |
| KR | 102034620 B1 | 11/2019 |
| WO | 2021/257602 A1 | 12/2021 |
| WO | 2022/035603 A1 | 2/2022 |
| WO | 2022/125274 A1 | 6/2022 |

OTHER PUBLICATIONS

Non-Final Office Action for U.S. Appl. No. 16/945,283, filed Jul. 31, 2020 on behalf of Psemi Corporation. date Mar. 2, 2021. 24 pages.

Final Office Action for U.S. Appl. No. 16/902,032, filed Jun. 15, 2020 on behalf of pSemi Corporation. dated Oct. 15, 2021. 17 Pages.

International Search Report and Written Opinion for International PCT Application No. PCT/US2021/037479 filed on Jun. 15, 2021 on behalf of pSemi Corporation, dated Oct. 7, 2021. 8 pages.

Notification of Preliminary Examination for CN Application No. 202110662394.7 filed of Jun. 15, 2021, on behalf of pSemi Corporation, dated Jul. 29, 2021. CN Original+ English Translation. 2 Pages.

Final Office Action for U.S. Appl. No. 16/945,283, filed Jul. 31, 2020, on behalf of pSemi Corporation. dated Dec. 3, 2021. 31 Pages.

International Search Report and Written Opinion for International Application No. PCT/US2021/059387 filed on Nov. 15, 2021 on behalf of pSemi Corporation dated. 9 pages.

International Search Report and Written Opinion for International PCT Application No. PCT/US2021/043544 filed on Jul. 28, 2021 on behalf of pSemi Corporation. dated Feb. 8, 2022. 12 pages.

International Search Report and Written Opinion for International PCT Application No. PCT/US2021/043544 filed on Jul. 28, 2021 on behalf of pSemi Corporation. dated Jan. 21, 2022. 10 Pages.

Corrected Notice of Allowability for U.S. Appl. No. 16/945,283, filed Jul. 31, 2020 on behalf of pSemi Corporation dated Jul. 25, 2022. 4 pages.

Non-Final Office Action for U.S. Appl. No. 16/902,032, filed Jun. 15, 2020 on behalf of pSemi Corporation. dated Mar. 29, 2022. 14 Pages.

Non-Final Office Action for U.S. Appl. No. 17/386,374, filed Jul. 27, 2021 on behalf of pSemi Corporation dated Jul. 15, 2022. 29 pages.

Non-Final Office Action issued for U.S. Appl. No. 17/386,409, filed Jul. 27, 2021, on behalf of pSemi Corporation. dated Jul. 13, 2022. 28 Pages.

Notice of Allowance for U.S. Appl. No. 16/945,283, filed Jul. 31, 2020 on behalf of pSemi Corporation dated May 10, 2022. 12 pages.

\* cited by examiner

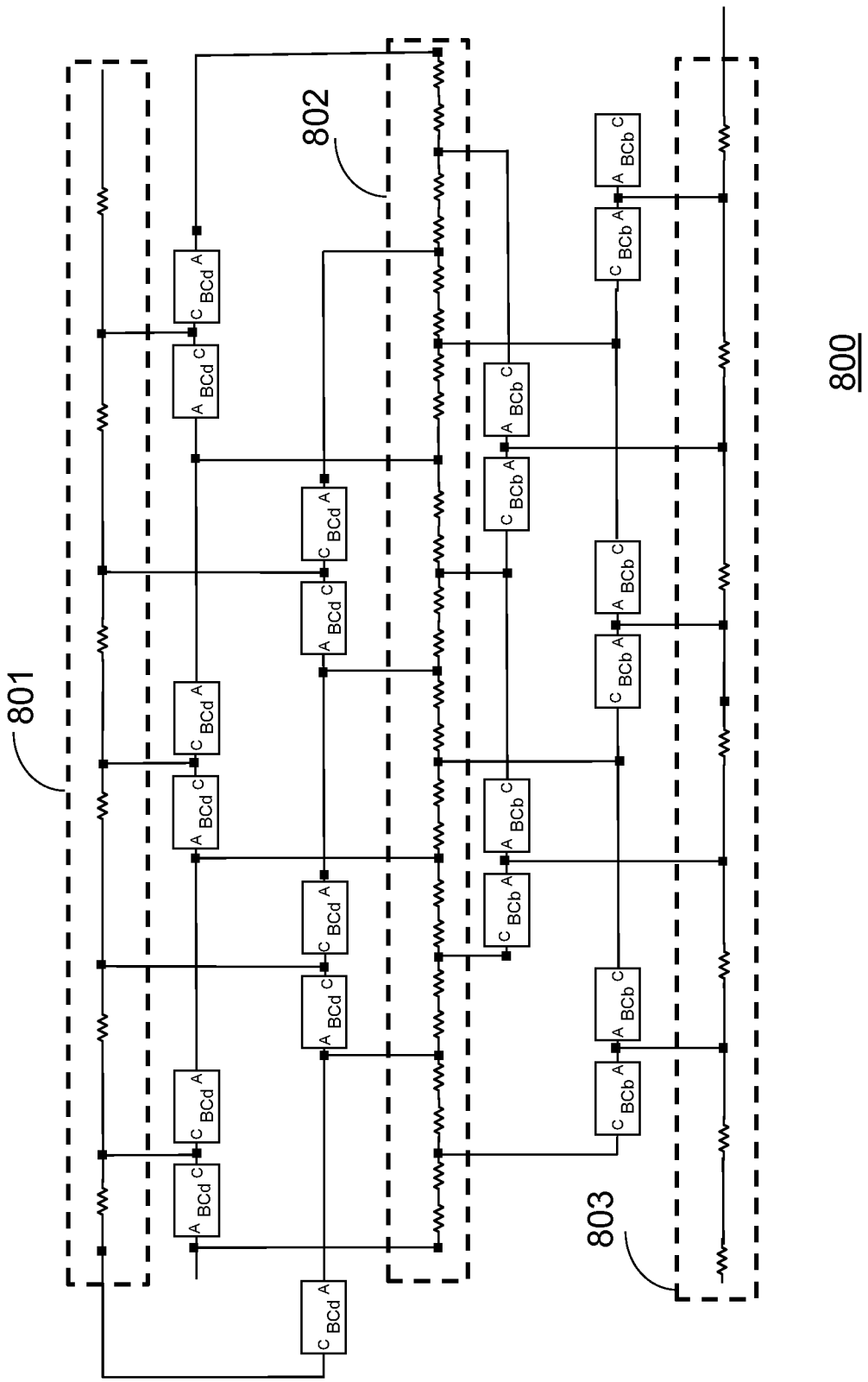

RF SWITCH STACK WITH CHARGE REDISTRIBUTION

CROSS-REFERENCE TO RELATED APPLICATIONS

The present application may be related to U.S. Pat. No. 10,236,872 B1, filed on Mar. 28, 2018, issued on Mar. 19, 2019, and entitled "AC Coupling Modules For Bias Ladders", incorporated herein by reference in its entirety. The present application may be also related to U.S. patent application Ser. No. 16/902,032 filed on Jun. 16, 2020, entitled "RF Switch Stack With Charge Control Elements", also incorporated herein by reference in its entirety.

FIELD

The present disclosure is related to Radio Frequency (RF) switch stacks, and more particularly to methods for designing RF switch stacks including charge redistribution arrangements and related apparatus.

BACKGROUND

When designing communication systems, RF switches are generally implemented in stacked configuration due to the large RF power handling requirement of such switch stacks. FIG. 1A shows a prior art field effect transistor (FET) switch stack (100) including a series arrangement of transistors $(T_1, \ldots, T_4)$ arranged in a shunt configuration. As may be the case, the FET switch stack (100) is biased using a gate resistive ladder including gate resistors $(R_{G1}, \ldots, R_{G4})$, a body resistive ladder including body resistors $(R_{B1}, \ldots, R_{B4})$, and a drain-source resistive ladder including drain-source resistors $(R_{DS1}, \ldots, R_{DS4})$.

In typical operative conditions, and when the transistors are in the ON state, the gate of each transistor may be biased at a positive voltage (e.g. +3V) larger than the threshold voltage of the corresponding transistor, and the drain/source/body of the same transistor may be biased at 0V. When the FET switch stack is in the OFF state, the drain/source of each transistor may be biased at 0V and the gate and body of each transistor may be biased at a negative voltage (e.g. −3V). As shown in FIG. 1A, the top end of the drain-source resistive ladder is connected to the antenna or other RF port (RF path), which is essentially a direct current (DC) ground, and the bottom end of the same ladder is connected to ground in both the ON and OFF states in case of a shunt configuration like the one shown in FIG. 1A. On the other hand, the bottom end would be connected to a bottom RF node or terminal in case of a series configuration. As such, and in an ideal/desired situation, when the FET switch stack is in the OFF state, the drain-source ladder would not draw any current, or a negligible current, meaning that the drain of each of the transistors $(T_1, \ldots, T_4)$ would experience the same DC voltage of approximately 0V.

When a large RF voltage is applied to the antenna, the FET switch stack (100), the drain-source resistive ladder, the gate resistive ladder and the body resistive ladder are all designed to distribute the RF voltage evenly among the FET switch stack (100). The RF signal, having no DC component, does not directly change the DC voltage at any point in the stack. However, during operation, there may be some currents generated within the transistors due to the RF signal applied, which may alter the DC voltage distribution. The RF signal at each point is superimposed on the existing DC voltage. When the FET switch stack (100) is in the "OFF" or non-conducting state, the FET switch stack (100) is designed to conduct no real component of current, which is current in phase with the RF voltage applied. The transistor stack appears as a purely capacitive impedance due to the series gate-drain capacitor Cgd, gate-source capacitor Cgs, plus an additional inherent capacitance between drain and source of each of the transistors $(T_1, \ldots, T_4)$. In the OFF state, the transistors will pass no real current with RF voltage applied across drain to source of the transistors as long as the magnitude of the RF voltage across each transistor is below a critical value (Vpeak). If the RF voltage exceeds such value, the transistor will fail or "break down" and start conducting real current. The value of Vpeak for each transistor is a function of the relative DC voltages between the drain/source DC voltage and the gate DC voltage. The more negative the gate voltage relative to the drain/source voltage, the higher the value of Vpeak. The body DC voltage can also have an impact if it is beyond a certain range, although such impact is generally lower.

Since the maximum voltage each transistor $(T_1, \ldots, T_4)$ in the stack can "block" before breaking down is dependent on the amount of negative DC voltage differential between the gate and drain/source terminals, it may be desirable to make the gate terminal appear more negative relative to the drain/source voltage to increase this blocking voltage. This can be accomplished by making the drain/source terminals more positive and/or making the gate terminals more negative.

There may be cases in implementations of switch stacks where it is difficult, inconvenient or impossible to apply the desired DC voltages to every transistor in the stack. One example is if it is too costly to include circuitry that can bias the gate terminals negative relative to the drain/source terminals. Another example would be if it is advantageous to have different DC voltage levels for different transistors in the stack because some transistors may need to block more voltage than others. A third example would be if there are undesirable DC currents being generated within the stack that disturbs the externally applied voltage in a uniform or non-uniform manner. Using the example of leakage current in transistor stacks, the above-mentioned points are further clarified.

In practical conditions, more in particular in stacked switches experiencing large RF swings during the OFF state, each transistor within the stack will generate an undesired leakage current that flows from the drain/source to the body of the transistor. Such generated current is referred to as "Ibody" throughout this document. With reference to FIG. 1A, arrows (ib1, . . . , ib4) indicate the body currents, each flowing from the body of the corresponding transistor down through the body resistive ladder and sinking into the power supply $(V_B)$. Moreover, and as indicated by arrows (id1, . . . , id4), current will flow from the antenna (DC ground) and ground through the drain-source resistive ladder and to the drain-sources of the transistors within the stack. It is pointed out that as the drain-source resistive ladder is connected at both ends to ground, the current flowing in such ladder may follow different directions, downward or upward as indicated by the arrows (id1, . . . , id4), and depending on the location of the current within the drain-source resistive ladder.

As a result of what has been described above, the flow of the unwanted leakage current, Ibody, throughout the switch stack, modifies the DC voltage distribution across such switch stack. In other words, various switch stack nodes will experience undesired DC bias voltages different from what the biasing circuit would have provided to such nodes in the absence of such leakage current. Throughout the disclosure, the undesired effect of the body leakage current on the DC bias voltage distribution throughout the stack is referred to as the "de-biasing" effect.

With further reference to FIG. 1A, the leakage current flowing from the body to the power supply ($V_B$) will result in voltage drops across the resistors of the body resistive ladder, and as a result, the body of each of the transistors will experience a less negative voltage compared to the ideal/desired case with no leakage current. With the gate and the body resistive ladders being distinct, gate voltages will also not be impacted by the leakage current circulation across the FET switch stack. On the other hand, the flow of the leakage current from DC grounds to drain/sources of the transistors generates voltage drops across the resistors of the drain-source resistive ladder and as a result, the drain/source of the transistors will experience more negative voltages compared to the ideal/desired case of 0V DC. With the gate voltage remaining the same (e.g. −3V), this means that the gate-source voltages will be less negative compared to the ideal/desired scenario, resulting a degradation of power handling of the transistors. In what follows, this point will be further clarified using a numerical example.

FIGS. 1B-1C each show the FET switch stack (100) of FIG. 1A wherein, in the OFF state, the gate and the body resistive ladders are both biased, for example, with a negative DC voltage of −3V and the drain-source resistive ladder is connected to DC ground through the ports.

FIG. 1B represents the ideal/desired situation where it is assumed there is no body leakage current. As can be seen in FIG. 1B, the drains of all the transistors are all biased at 0V, the gates and the bodies are all at −3V and there is practically no DC current flowing through the resistive ladders. This is the ideal/desired scenario.

Ibody exists because of the peak difference in potential between drain to gate. Carriers are generated from the peak voltage. Holes exit through the body, electrons exit through the drain/source. Although generation is pulsed, it is filtered by the resistances and capacitances on the way out. On the other hand, FIG. 1C shows how the DC voltage distribution across the stack is changed resulting in the flow of the leakage current within the switch stack. For example, the drains of the transistors ($T_1, \ldots, T_4$) are now experiencing DC voltages of (−0.2V, −0.4V, −0.2V, 0V) respectively, instead of all sitting at the desired DC voltage of 0V as indicated in FIG. 1B. As further shown in FIG. 1C, the middle transistors experience the most change in drain voltage due to the flow of Ibody from top and bottom of the drain-source ladder towards the center of the ladder.

Continuing with the same example, and as for the body voltages, the bodies of the transistors ($T_1, \ldots, T_4$) may experience voltages of (−2.6V, −2.2V, −1.9V, −1.5V) instead of all being at the desired voltage of −3V. This is further illustrated by the curves (101, 102) of FIG. 2, representing exemplary DC average voltage profiles for drains and bodies of the transistors of a switch stack respectively, plotted with reference to the position of the transistors in the stack (bottom position to the right, top position to the left). As can be noticed from graph (101) and as mentioned previously, the transistor in the middle of the stack experiences the most deviation in DC drain voltage compared to the ideal/desired scenario, due to the flow of the undesired current "Ibody" within the drain-source resistor ladder. As for the bodies of the transistors, the deviation from the desired voltages is larger for the transistors located closer to the top of the stack, as illustrated by graph (102) of FIG. 2.

One way to reduce the undesired voltage drops across the bias resistors as described above is to reduce all of the biasing resistors values. This comes at the expense of an overall circuit performance degradation. Firstly, as a result of implementing smaller biasing resistances, the equivalent resistance of the switch stack in the OFF state (Roff) will be smaller. This will result in a degradation of the Quality factor (Q) of the circuit. In other words, there is a tradeoff between the power handling of the switch stack and overall system performance parameters such as Q, such tradeoff imposing challenges when designing switch stacks as part of RF communication systems.

SUMMARY

As mentioned above, undesired currents generated in switch stacks during operative conditions, more in particular when such switch stacks are in the OFF state, may alter the balance of a desired DC voltage distribution across the switch stack. There is a need for an effective and practical solution to undo such undesired effects on the voltage distribution.

With continued reference to the body leakage current case as mentioned above, there are two issues associated with the presence of the body leakage current, Ibody, when FET switch stacks are in OFF state:

1. Leakage current generation issue: the negative power supply is required to generate and handle such current circulating within the switch. This current is much larger compared to the near zero current in the ideal/desired scenario where the leakage current would not have been present. This results in a more expensive design, at least from the standpoint of the required space on the chip.
2. Bias voltage distribution issue: the flow of the body leakage current changes the voltage distribution across the stack causing reduced power handling capability for the transistors within the switch stack.

Methods and devices described in the present disclosure address both the generation issue and the distribution issue as described above. As will be detailed later, the disclosed methods and devices allow the biasing resistor values in a FET switch stack to be increased by providing some local charge support at specific points in such switch stacks. According to various embodiments of the present disclosure, this may be performed by redistributing charges through the body and/or drain-source charge redistribution resistive ladders.

According to a first aspect, a field effect transistor (FET) switch stack circuit comprising: a stacked configuration of series-connected FET transistors coupled to a radio frequency (RF) terminal; a charge redistribution resistive ladder coupled to the RF terminal, the charge redistribution resistive ladder comprising series-connected charge redistribution resistors and tapping points; and a drain/source bridge network configured to selectively couple/decouple a first set of one or more tapping points on the charge redistribution resistive ladder with/from drain or source terminals of the FET transistors and a body bridge network configured to selectively couple/decouple a second set of one or more tapping points on the charge redistribution resistive ladder with/from body terminals of the FET transistors, wherein, when the FET switch stack is in OFF state: the FET switch stack is configured to be coupled to an RF signal at the RF terminal, and to distribute RF voltages at the tapping points; and during a first portion of a period of the RF signal, the drain/source bridge network couples the first set of one or more tapping points to the drain or source terminals of the FET transistors and the body bridge network couples the second set of one or more tapping points to the body terminals of the FET transistors.

According to a second aspect, a field effect transistor (FET) switch stack circuit is described, comprising: i) a stacked configuration of series-connected FET transistors; ii) a drain/source charge redistribution resistive ladder comprising series-connected drain/source charge redistribution resistors and a set of one or more drain/source tapping points in correspondence with drains or sources of FET transistors of the series-connected FET transistors; iii) a body charge redistribution resistive ladder comprising series-connected body charge redistribution resistors and a set of one or more body tapping points in correspondence with bodies of FET transistors of the series-connected FET transistors; and iv) a drain-body bridge network configured to selectively couple/decouple the set of one or more drain/source tapping points with/from the set of one or more body tapping points, thus selectively coupling/decoupling drains or sources of the FET transistors with/from bodies of the FET transistors to redistribute charges throughout the FET transistors.

According to a third aspect, a radio frequency (RF) switch stack circuit is described, comprising: a stack of FET transistors connected in a series configuration and configured to be coupled to an antenna to receive an RF signal; a body resistive ladder comprising body resistors coupled to bodies of FET transistors of the stack of FET transistors; a drain-source resistive ladder comprising drain-source resistors coupled to drain/sources of FET transistors of the stack of FET transistors; a charge redistribution resistive ladder comprising charge transfer resistors and at least one tapping point; and a bridge network configured to selectively couple/decouple the at least one tapping point of the charge redistribution resistive ladder with/from the drain-sources and/or bodies of the transistors of the stack of transistors during a portion of a period of the RF signal in order to selectively source current from the charge redistribution resistive ladder and deliver said current to the drain-source resistive ladder and/or sink current from the body resistive ladder and deliver said current to the charge redistribution resistive ladder.

According to a fourth aspect, a method of adjusting FET switch stack bias when a FET switch stack is in OFF state, the method comprising: coupling a charge redistribution resistive ladder across the FET switch stack, the charge redistribution ladder comprising tapping points; applying an RF signal across the FET switch stack in the OFF state to generate voltages at the tapping points; during a first portion of the RF signal period, coupling a first tapping point to a drain/source terminal of a FET transistor of the FET switch stack, and coupling a second tapping point to a body terminal of the FET transistor of the FET switch stack, thereby pulling up a voltage of the drain/source terminal of the FET transistor and pulling down a voltage of the body terminal of the FET transistor.

Further aspects of the disclosure are provided in the description, drawings, and claims of the present application.

DESCRIPTION OF THE DRAWINGS

FIGS. 8A-8H show exemplary current flow diagrams of a FET switch stack according to various embodiments of the present disclosure.

DETAILED DESCRIPTION

Figure 3:
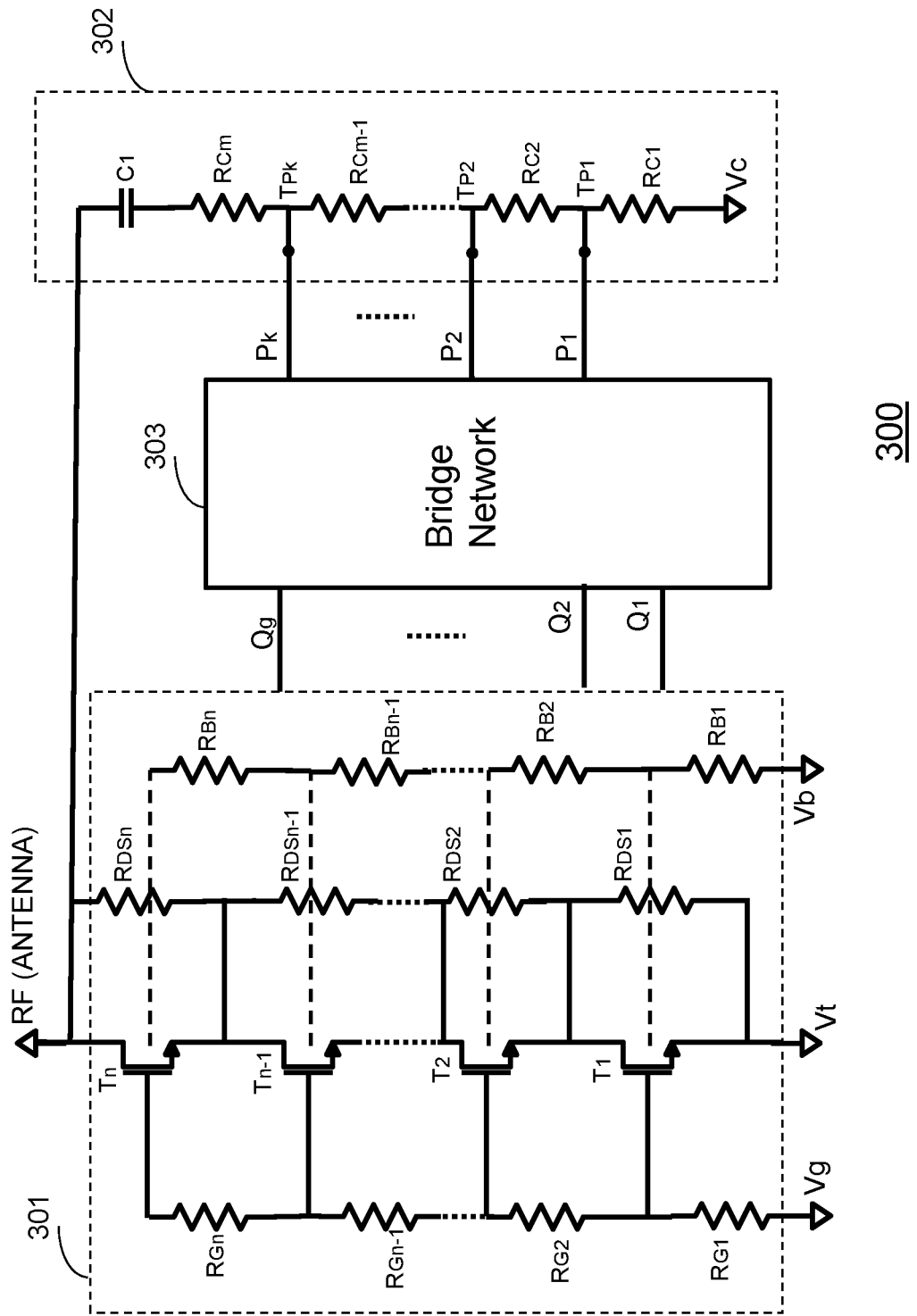
FIG. 3 shows an exemplary switch stack according to an embodiment of the present disclosure.

FIG. 3 shows a FET switch stack circuit (300) in accordance with an embodiment of the present disclosure. The FET switch stack circuit (300) comprises a switching circuit (301), a bridge network (303), a charge redistribution resistive ladder (302) comprising a plurality of charge transfer resistors ($R_{C1}, \ldots, R_{Cm}$) connected in series, and a capacitor (C1) serially connected to the plurality of resistors ($R_{C1}, \ldots, R_{Cn}$). The switching circuit (301) comprises a stack of transistors ($T_1, \ldots, T_n$) connected in series, a gate resistive ladder including resistors ($R_{G1}, \ldots, R_{Gn}$), a drain-source resistive ladder including resistors ($R_{DS1}, \ldots, R_{DSn}$), and a body resistive ladder including resistors ($R_{B1}, \ldots, R_{Bn}$). The transistors ($T_1, \ldots, T_n$) are coupled to an RF path on the top side to receive RF signals (e.g. from an antenna) and are coupled to a reference voltage (Vt) at another end. The gate resistive ladder is coupled to gate terminals of transistors ($T_1, \ldots, T_n$), and also coupled to reference voltage ($V_g$). The body resistive ladder is coupled to the body terminal of transistor ($T_n$) at one end and coupled to reference voltage ($V_b$) at another end. For convenience, a "stack unit" can be defined as a 1/n portion of the stack, containing one unit of any components of which there are n in the stack, such as $R_{G2}$, $T_2$, $R_{DS2}$ and $R_{B2}$.

With continued reference to FIG. 3, the charge redistribution resistive ladder (302) further comprises one or more tapping points (Tp1, ..., Tpk). In operative conditions when the FET switching circuit (301) is in the OFF state, capacitor (C1) couples the RF swing from the antenna to the ladder (302), providing supply voltages across the charge redistribution resistive ladder, and more specifically at the tapping points (Tp1, ..., Tpk). The bridge network (303) comprises nodes (P1, ..., Pk) connected to corresponding tapping points (Tp1, ..., Tpk), and nodes (Q1, ..., Qg) used to connect the bridge network (303) to the switching circuit (301). According to embodiments of the present disclosure, each node (Q1, ..., Qg) is connected either to a drain/source terminal (by connection to a corresponding node on the drain/source resistive ladder) or a body terminal (by connection to a corresponding node on the body resistive ladder) of a corresponding transistor of any one of the transistors ($T_1, ..., T_n$) of the switching circuit (301).

In accordance with the teachings of the present disclosure, during a portion of the RF swing cycle, each tapping point (Tpi), i=1, ..., k, is selectively coupled to either a drain/source terminal or a body terminal of a corresponding transistor of the switching circuit (301) via a corresponding pair of nodes (Pi, Qj), i=1, ..., k, j=1, ..., g, of the bridge network (303). During another portion of the RF swing, the tapping point (Tpi) is selectively decoupled from the corresponding drain/source or body terminal of the switching transistor of the switching circuit (301). In other words, during a portion of the RF swing cycle, a set of drain/source terminals and tapping points are coupled/paired with each other and a set of body terminals and tapping points are coupled/paired with each other.

In accordance with further embodiments of the present disclosure, the voltages at the tapping points are such that the set of (drain/source-terminal, tapping point) pairs source current from the charge redistribution resistive ladder and deliver it to the drain-source resistive ladder. Additionally, the set of (body terminal, tapping point) pairs sink current from the body resistive ladder and deliver it to the charge redistribution resistive ladder. Since both the sinking and sourcing processes occur along the entire switch stack, the charge redistribution resistive ladder can redistribute charges locally throughout the switch stack, creating a net current flow from the body resistive ladder to the drain-source resistive ladder, thereby reducing the de-biasing effect. In other words, the voltages at the tapping points are such that, when a tapping point is coupled with the drain/source terminal of a transistor, the voltage of such drain/source terminal is pulled up, thereby counter balancing the effect of the body leakage current, which would usually result in a dropping voltage. Similarly, when a tapping point is coupled with the body terminal of a transistor, the voltage of such body terminal is pulled down, to counter-balance the body leakage current, Ibody, usually resulting in a raised body voltage. In what follows, this point is further clarified using some exemplary embodiments in accordance with the present disclosure.

Figure 4:
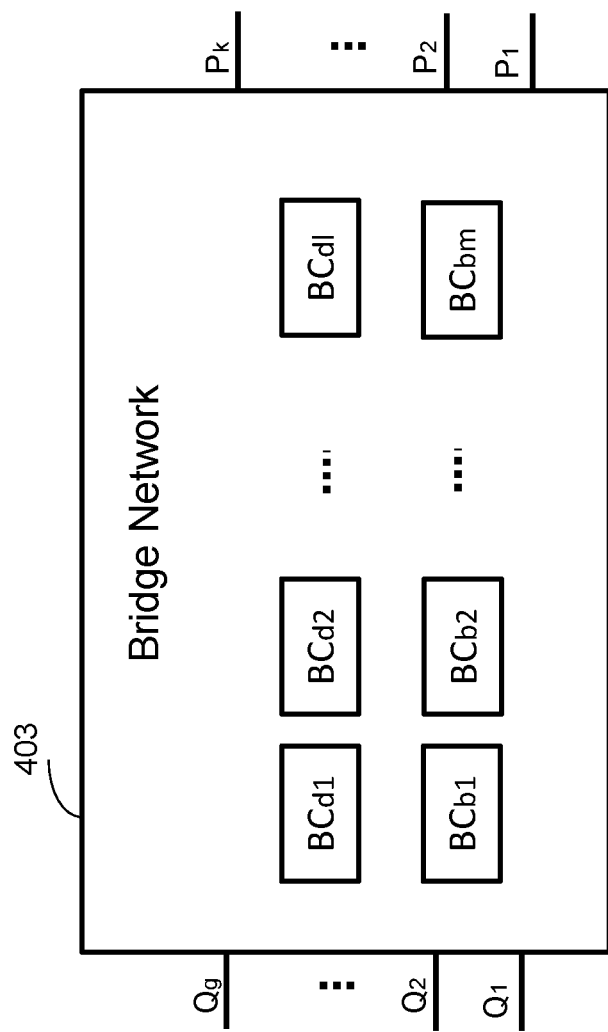
FIG. 4 shows an exemplary bridge network according to an embodiment of the present disclosure.

FIG. 4 shows an exemplary composition (403) of the bridge network (303) previously shown in FIG. 3 according to an embodiment of the present disclosure. The bridge network (403) comprises one or more drain bridge circuits ($BC_{d1}, ..., BC_{dl}$), and one or more body bridge circuits ($BC_{b1}, ..., BC_{bm}$), where 'l' and 'm' are integers greater than or equal to one and independent from each other. With reference to the combination of FIGS. 3-4, each drain bridge circuit may couple a corresponding tapping point of the charge redistribution resistive ladder (302) to the drain/source terminal of a corresponding transistor of the switch stack (301). Similarly, each body bridge circuit may couple a corresponding tapping point of the charge redistribution resistive ladder (302) to the body terminal of a corresponding transistor of the switch stack (301). The person skilled in the art will understand that the use of the term "drain" bridge circuit and "drain" terminal throughout the present disclosure is for conciseness purposes only, as the intended meaning of such terms is that of a "drain/source" bridge circuit and a "drain or source" terminal, as noted above.

Figure 5:
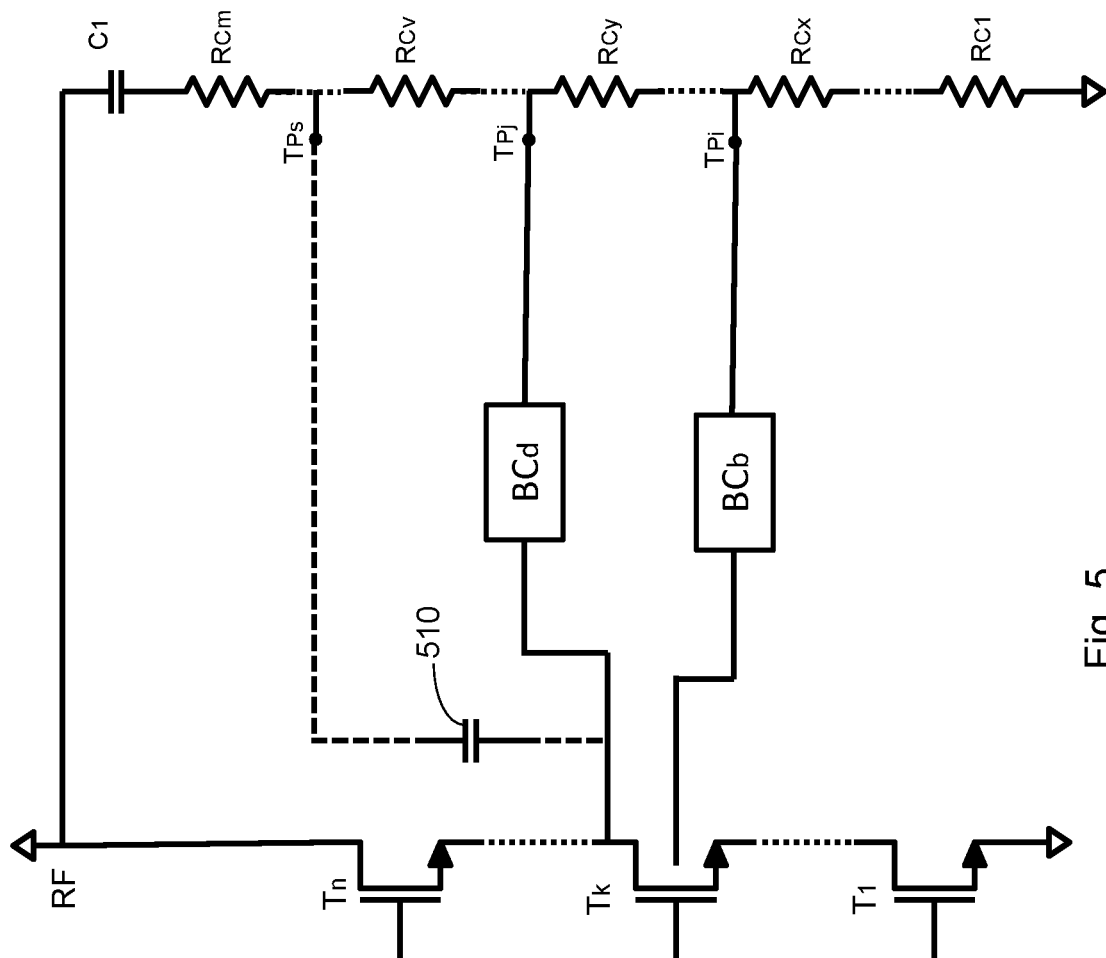
FIG. 5 shows a FET switch stack according to a further embodiment of the present disclosure.

Reference will now be made to FIG. 5 where a portion of the FET switch stack circuit (300) of FIG. 3 is shown. For the sake of clarity and ease of understanding, only a subset of the constituents of the switch stack circuit (300) of FIG. 3 is shown in FIG. 5 to illustrate the functionality of the bridge circuits and the interaction of such bridge circuits with the transistors of the switch stack and the charge redistribution resistive ladder. In particular, FIG. 5 shows an example where the bridge network (403) of FIG. 4 only contains one drain bridge circuit (BCd) and one body bridge circuit (BCb) for the sake of simplicity.

As shown in FIG. 5, drain bridge circuit (BCd) is coupled at one end to tapping point ($T_{Pj}$), and at another end, to the drain/source terminal of a transistor (Tk). Similarly, body bridge circuit (BCb) is connected at one end to tapping point ($T_{Pi}$) and at another end to the body terminal of transistor (Tk). The drain bridge circuit (BCd) is configured so that, during a portion of the RF swing cycle, the drain bridge circuit (BCd) is in a conducting (ON) state, thereby coupling tapping point ($T_{Pj}$) to the drain/source terminal of transistor (Tk). During another portion of the RF swing, the drain bridge circuit (BCd) is, on the other hand, selectively configured to be in a non-conducting (OFF) state, thereby decoupling/electrically isolating tapping point ($T_{Pj}$) from the drain/source terminal of transistor (Tk). Similar considerations apply to the body bridge circuit (BCb).

Figure 1A:
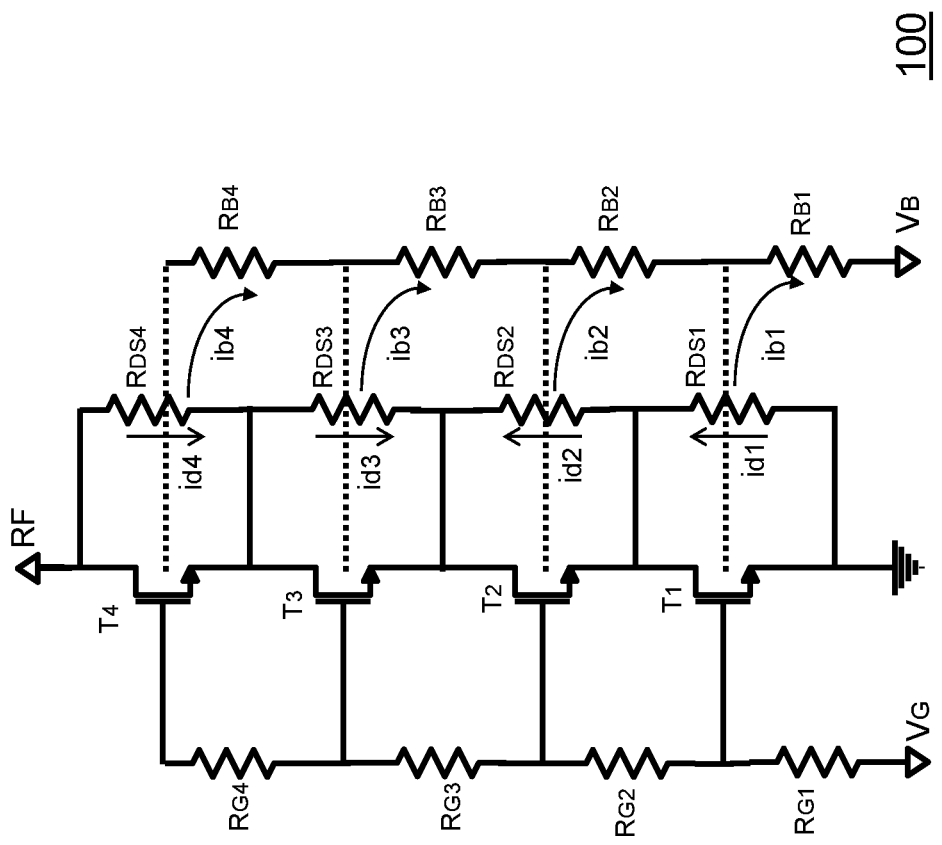
FIGS. 1A-1C show prior art FET switch stacks.
Figure 1C:
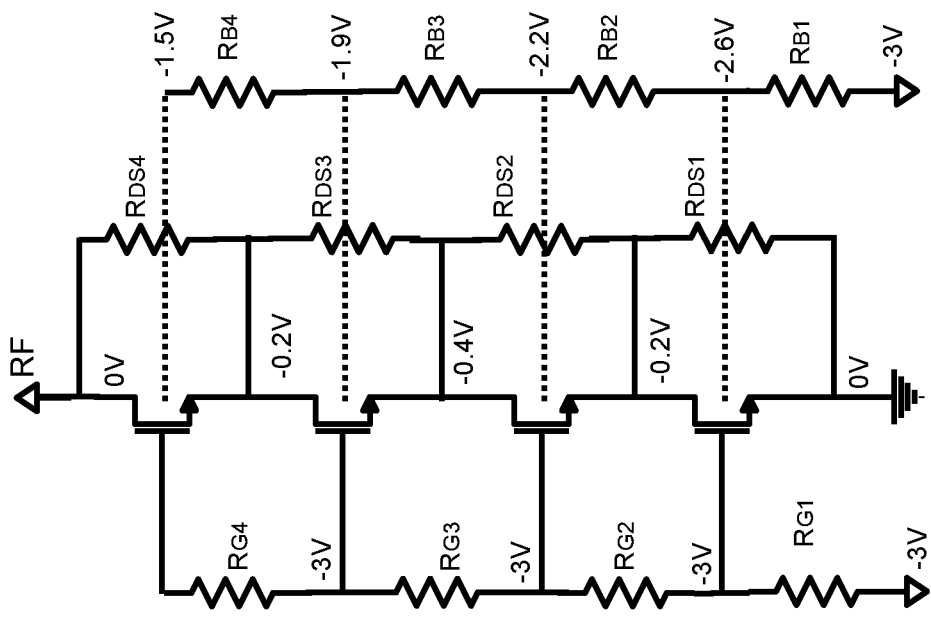
Figure 1B:
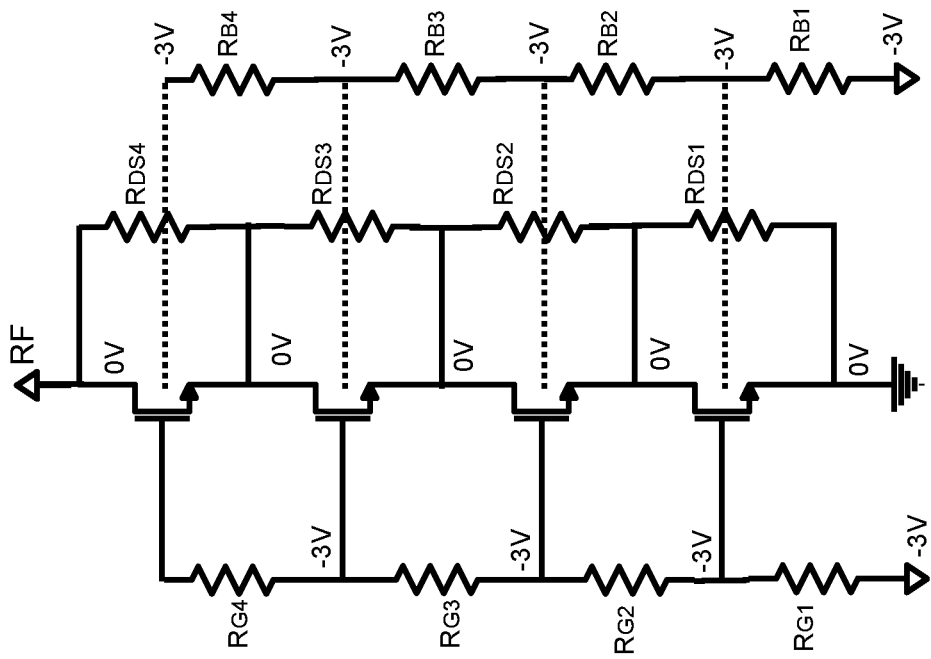
Figure 2:
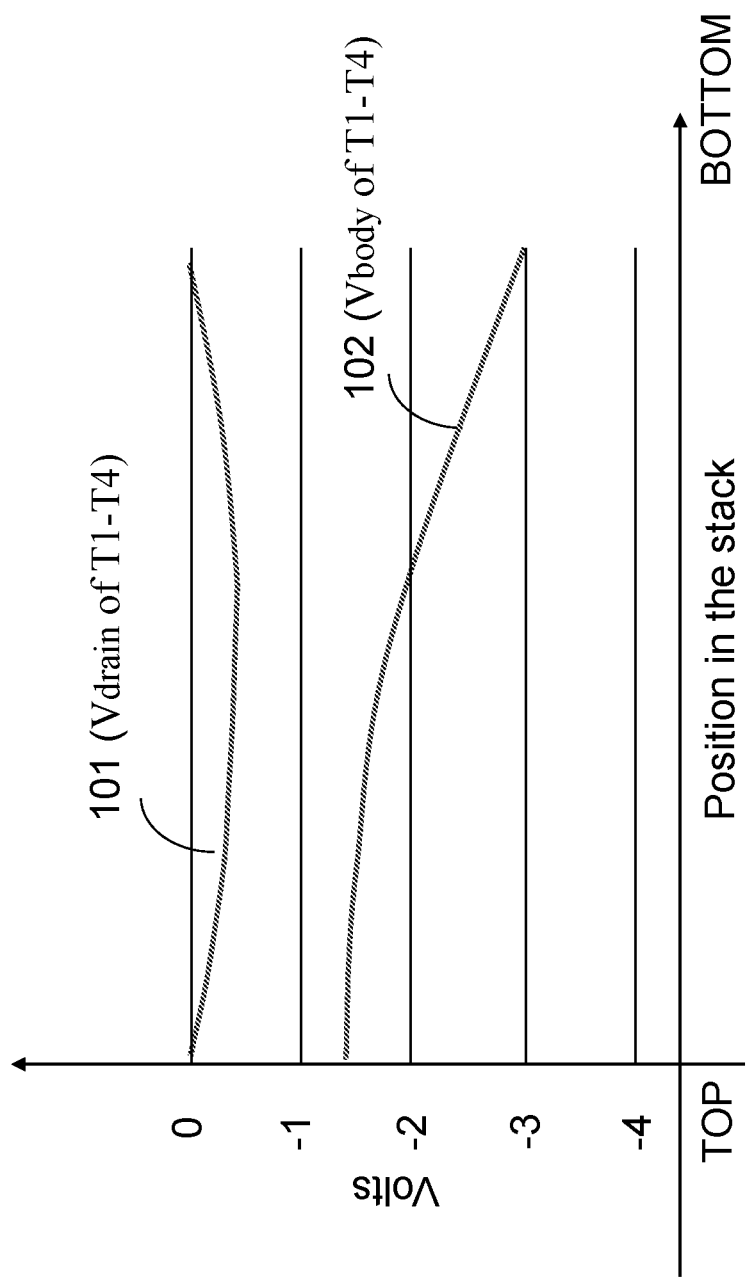
FIG. 2 shows prior art graphs illustrating variations of drain and body bias voltages vs. position in a FET switch stack in an OFF state.

As described previously, when the transistors in the switch stack are in the OFF state, the drain/source of each transistor may be DC-biased at e.g. 0V and the gate and body of each transistor may be DC-biased at a negative voltage (e.g. −3V). The charge redistribution resistive ladder is DC-biased at some intermediate voltage between the voltage on the drain-source resistive ladder and the voltage on the body resistive ladder, for example at the mid-point, which would be −1.5V in this case. As also described previously, when a large RF voltage is applied to the antenna, the FET switch stack (100) of FIG. 1A, the drain-source resistive ladder, the gate resistive ladder and the body resistive ladder are all designed to distribute the RF voltage evenly among the FET switch stack. This is also true for the charge redistribution resistive ladder. Due to the increase in RF amplitude from the ground end to the antenna end, there will be certain tapping points in the charge redistribution resistor ladder or network that are temporarily higher in voltage than certain drain/source terminals for large enough RF amplitude. The difference in RF amplitude at the certain tapping point and the RF amplitude at the certain drain/source terminal is greater than the difference in DC bias point of the charge redistribution resistive ladder and the DC bias point of the drain/source terminals. Similarly, there will be certain tapping points in the charge redistribution resistor network that are temporarily lower in voltage than certain body terminals for large enough RF amplitude. It follows then that due to the increase in RF amplitude from the ground end to the antenna end, there will be certain points in the body resistor ladder or network that are temporarily higher in voltage than other certain points in the drain/source resistor ladder or network for large enough RF amplitude.

Figure 6A:
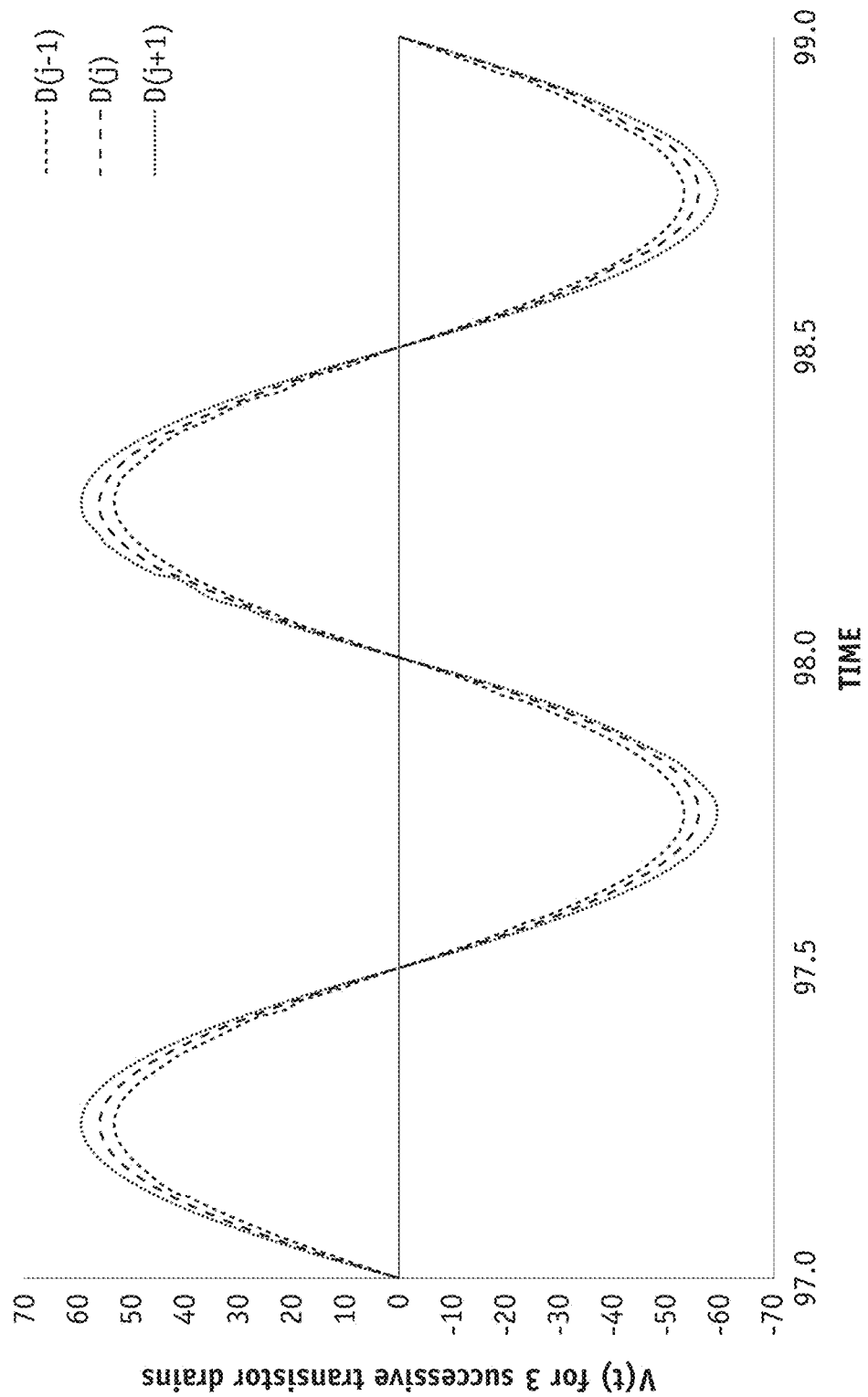
FIG. 6A shows exemplary RF voltage waveforms for drain/source of transistors in the stack according to embodiments of the present disclosure.

To further illustrate this, reference is made to FIG. 6A, which shows the voltage over time V(t) on three successive drains D(j−1), D(j), and D(j+1) (from lower to higher in the stack) over the course of two cycles (positive-negative-positive-negative) of the RF waveform. Transistors higher in the stack have increased percentage of the total RF signal, that is they have higher peak positive voltage and lower peak negative voltage.

Figure 6B:
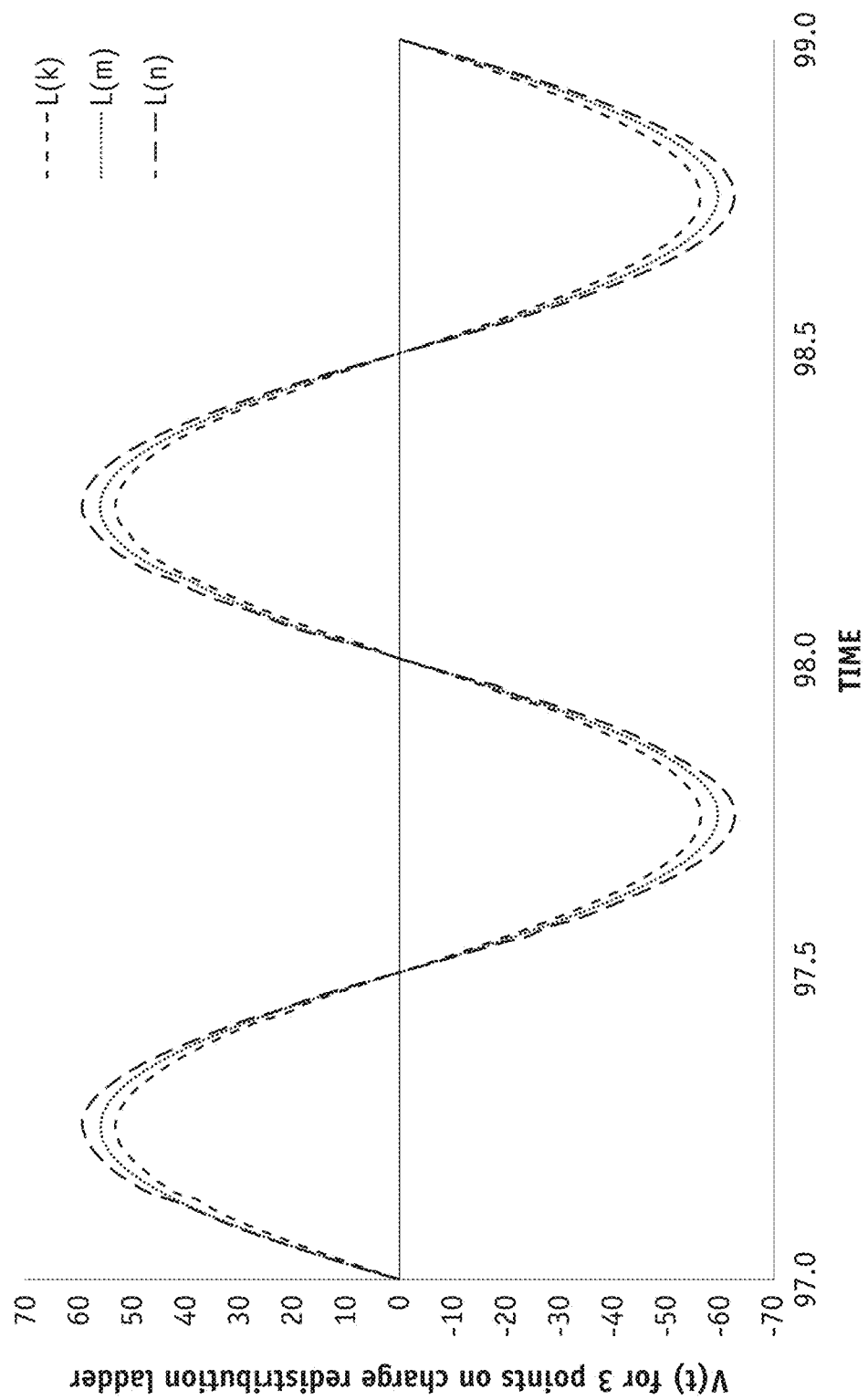
FIG. 6B exemplary RF voltage waveforms for body of transistors in the stack according to an embodiment of the present disclosure.

On the other hand, FIG. 6B shows the voltage over time V(t) on three tapping points L(k), L(m), L(n) (from lower to higher in the ladder) of the charge redistribution resistive ladder over the course of the two cycles of the RF waveform. These tapping points line up with successive transistors $T_{j-1}$, $T_j$ and $T_{j+1}$, but there can be intermediate tapping points between these. As with the transistor drain/source V(t) waveforms shown in FIG. 6A above, points higher in the ladder have increased percentage of the total RF signal. The person of skill in the art will understand that there can be any number of tapping points in the ladder within one transistor interval, so curves of any intermediate amplitude are possible. DC voltage offset between the tapping points and transistor drain points can also be noticed from FIGS. 6A-6B.

Upon a comparison between FIGS. 6A and 6B, a voltage offset between voltage on drains D(j−1), D(j), and D(j+1) and voltage on lined-up tapping points L(k), L(m), L(n) can be observed. As a consequence, a tapping point may be selected such that the RF amplitude of the tapping point is either greater or less than the RF amplitude at the drain/source terminal. Further, the amount that the RF amplitude at the drain/source terminal is greater or less than the RF amplitude at the tapping point may be adjusted by selecting different tapping points on the charge redistribution ladder. The difference in amplitude combined with the DC offset will set the relative voltage as a function of time between a given drain/source terminal and a specific tapping point in the charge redistribution resistive ladder.

Figure 6C:
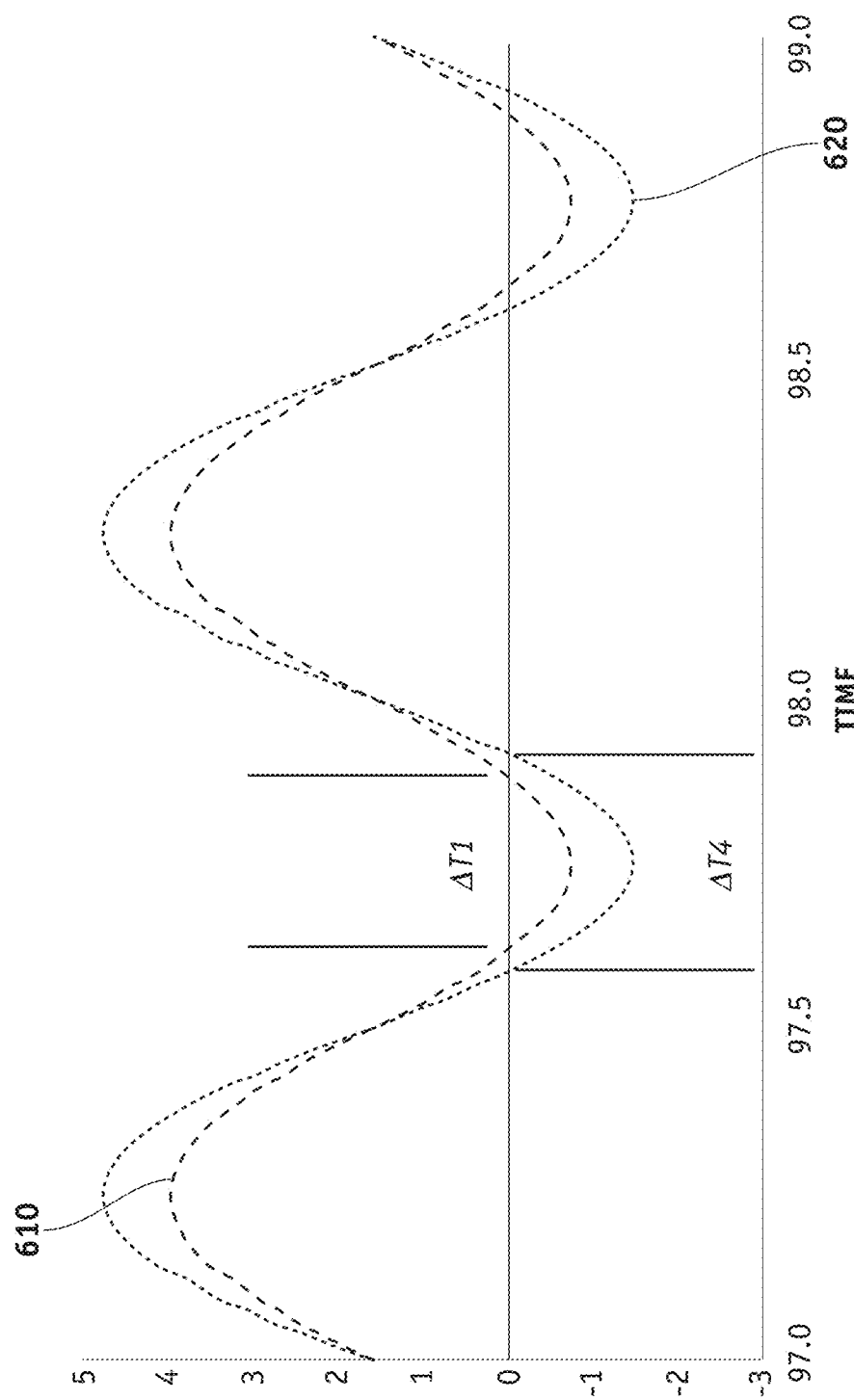
FIGS. 6C-6E show exemplary RF waveforms of a drain-source relative to charge redistribution tapping points according to an embodiment of the present disclosure.

FIG. 6C shows an example of relative voltage waveforms (620), (610) of voltage difference over time between drain (Dj) and ladder tapping points (Tp, Tr) respectively, (Tr) being above (Tp), where both (Tp) and (Tr) are below (Dj) when lined up in the stack. In particular, graph (610) shows relative voltage over time with respect to (Tr) and graph (620) shows relative voltage over time with respect to (Tp). With reference to waveform (610), it can be noticed that for tapping point (Tr), voltage on drain (Dj) is positive with respect to tapping point (Tr) for the positive swing portion of the RF cycle, but there is a part of the negative swing portion, ΔT1, where voltage on the drain (Dj) is negative with respect to the voltage on tapping point (Tr). This is due to the fact that tapping point (Tr) is lower in the stack than drain (Dj). Therefore, it has a smaller RF voltage swing, so it becomes less negative than (Dj) during the negative part of the RF signal. Thus, (Dj) is negative with respect to (Tr) for part of the negative swing. Similar observations can be made with reference to tapping point (Tp), graph (620) and time segment ΔT4.

Figure 6D:
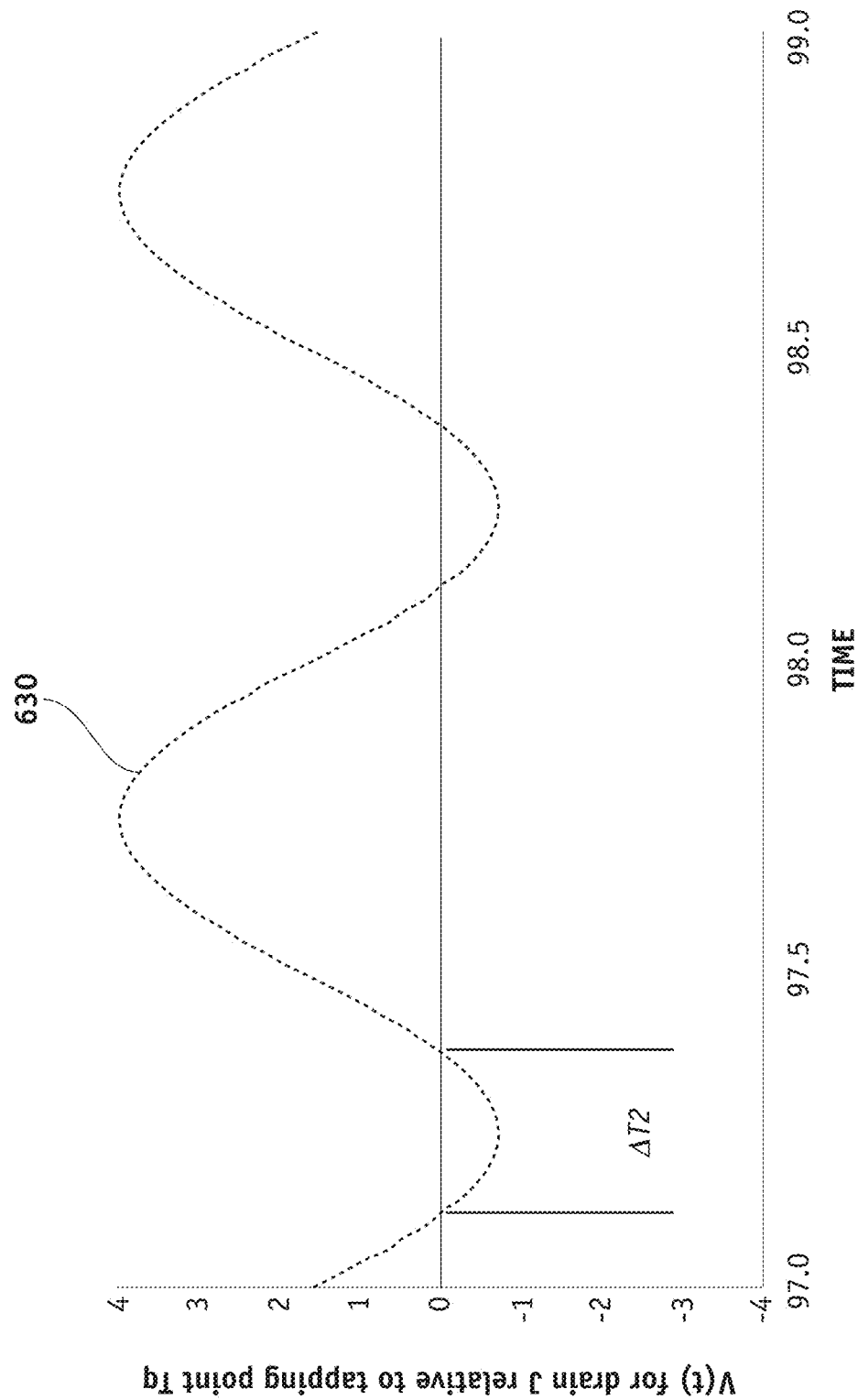

FIG. 6D shows an example of relative voltage waveform (630) of voltage difference over time between drain (Dj) and ladder tapping point (Tq), where (Tq) is above (Dj) when lined up in the stack. In particular, graph (630) shows relative voltage over time of drain (Dj) with respect to (Tq). Voltage on (Dj) is positive with respect to the voltage on tapping point (Tq) for the negative swing portion of the RF cycle, but there is a part of the positive swing portion, ΔT2, where the voltage difference is negative. This is due to the fact that tapping point (Tq) is higher in the stack than drain (Dj). Therefore, it has a larger RF voltage swing, so it becomes more positive than (Dj) during the positive part of the RF signal. Thus, (Dj) is negative with respect to (Tq) for part of the positive swing.

Figure 6E:
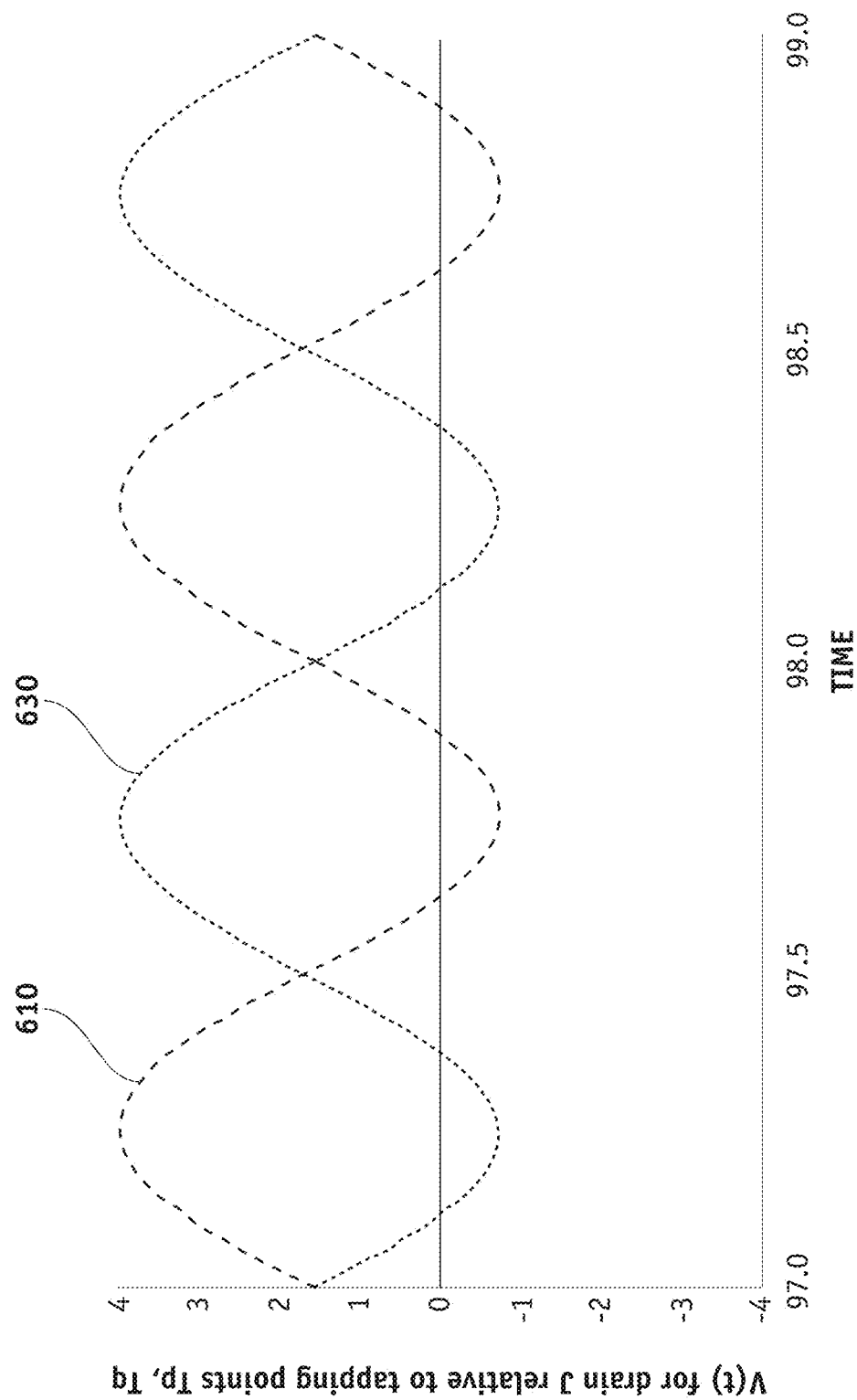

The two waveforms (610, 630) from FIGS. 6C and 6D respectively, are shown together in FIG. 6E. As can be noticed, during both the positive and negative portions of the RF waveform there is a time window where the drain/source (Dj) is negative with respect to one tapping point or another. For the exemplary case shown in FIG. 6E, the maximum amount that the drain/source is positive with respect to either tapping point is 4 volts. As described above, the drain/source bridge circuits according to embodiments of the present disclosure can be constructed and connected such that they conduct when a drain/source is at a lower voltage than a coupled tapping point (see negative voltage time windows in FIG. 6E) and they block conduction when a drain/source is at a higher voltage than a coupled tapping point (see positive voltage time windows in FIG. 6E).

Figure 6F:
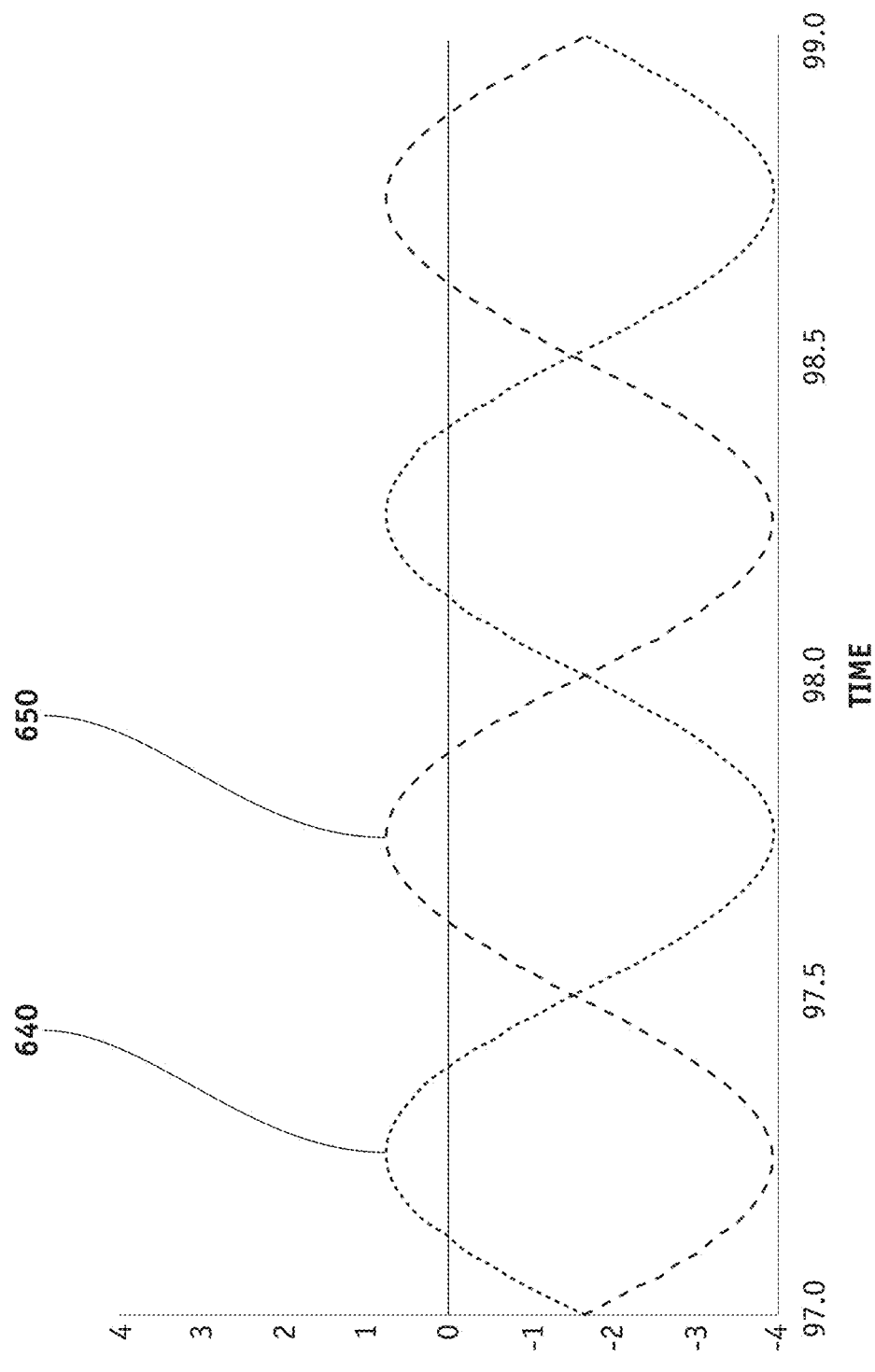
FIG. 6F shows exemplary RF waveforms of a body relative to charge redistribution tapping points according to an embodiment of the present disclosure.

Analogously to FIG. 6E for a drain/source terminal, FIG. 6F shows relative voltages (640, 650) as a function of time between a given body terminal and two specific tapping points (Tr, Ts) in the charge redistribution resistive ladder. In this case, there is a portion of each half cycle of the RF waveform where the body terminal is positive with respect to one or the other of the tapping points. Additionally, for the specific example shown in the figure, during the entire time span of the RF waveform, the body voltage is never more than 4 volts negative with respect to either tapping point voltage. As described above, with reference to this embodiment, the bridge circuits are constructed and connected such they conduct when the body is at a higher voltage than the coupled tapping point (positive voltage time windows in FIG. 6F) and they block conduction when the body is at a lower voltage than the coupled tapping point (negative voltage time windows in FIG. 6F).

Figure 7A:
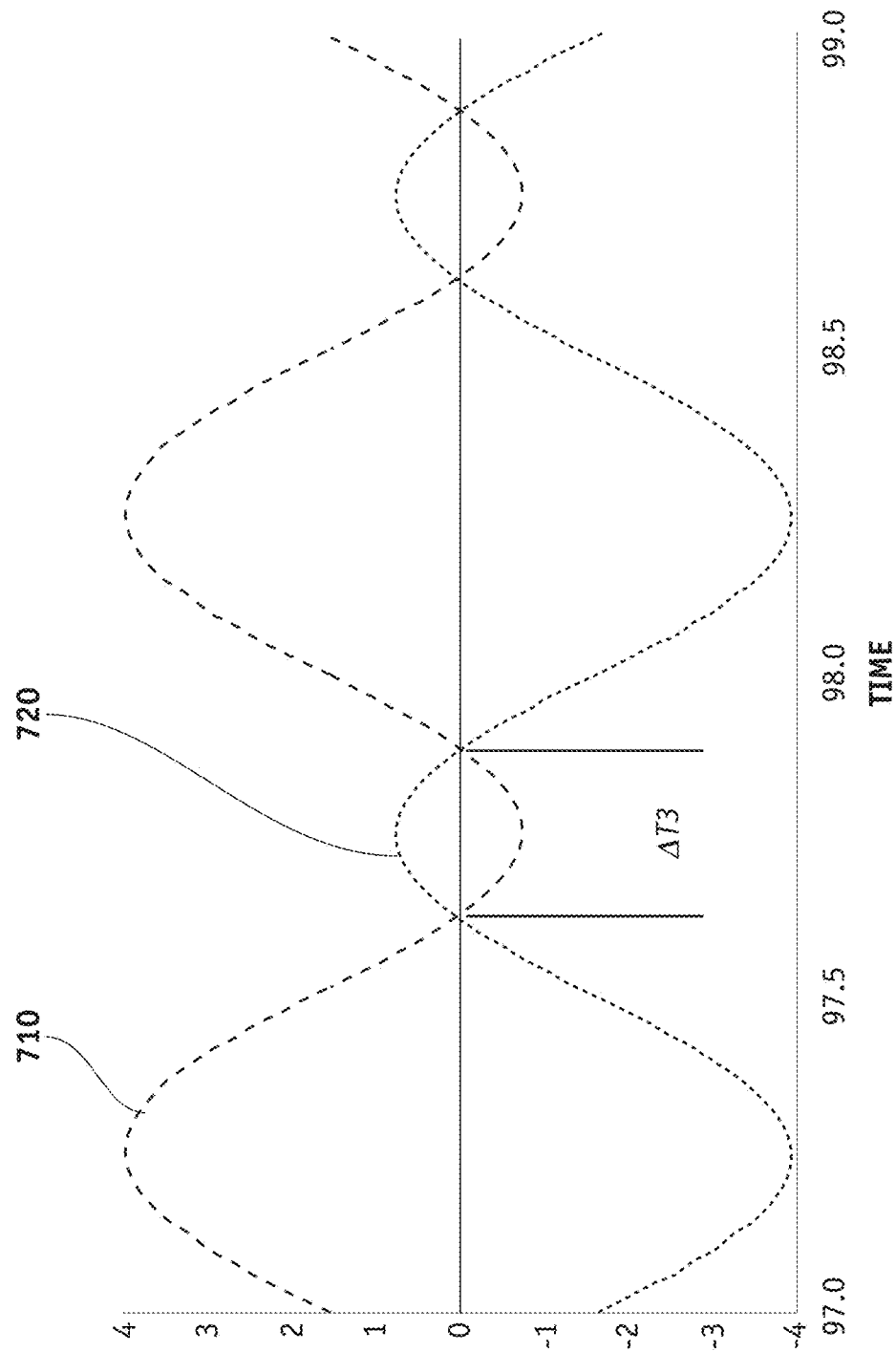
FIG. 7A shows exemplary RF waveforms of the drain terminal of a transistor in the stack and the body terminal of another transistor in the stack, both waveforms relative to the same tapping point according to an embodiment of the present disclosure.
Figure 7B:
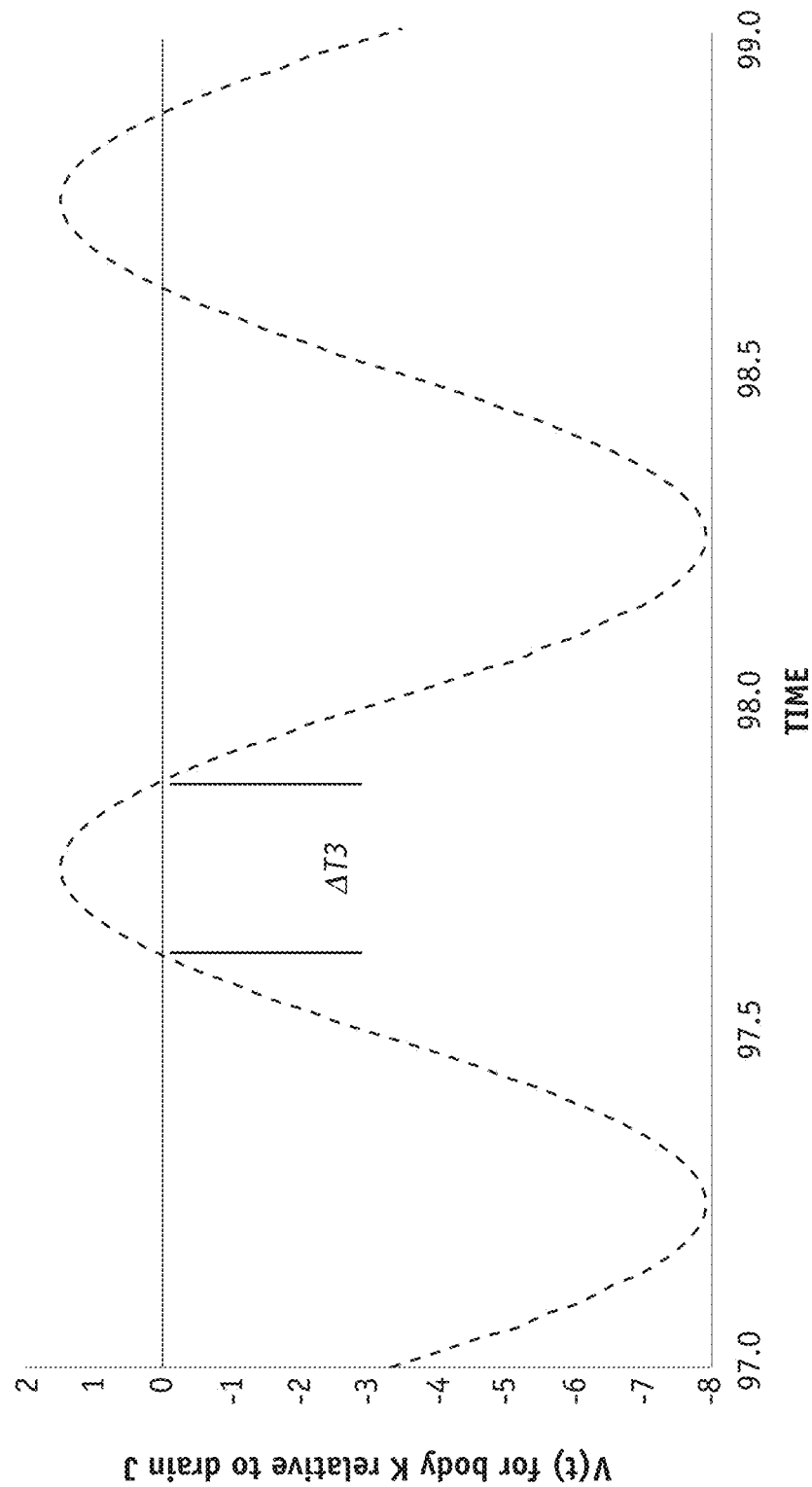
FIG. 7B shows exemplary RF waveforms of the body terminal of a transistor with respect to the drain terminal of another transistor in the stack according to an embodiment of the present disclosure.

FIG. 7A shows relative voltage waveforms (710, 720) over time of the drain/source terminal of a first transistor and the body terminal of a second transistor, both relative to the same tapping point (Tr). During the negative portion of the RF cycle there is a segment of time ΔT3 where the body terminal of the second transistor is positive with respect to the tapping point (Tr) at the same time that the drain/source of the first transistor is negative with respect to the tapping point (Tr). It follows that, during that time window, the body of the second transistor is positive with respect to the drain/source of the first transistor. This is better evidenced in FIG. 7B, which shows the voltage over time of the body of the referenced second transistor relative to the voltage over time of the drain/source of the first transistor.

As previously noted in FIG. 6C, graph (620) represents a voltage difference over a tapping point (Tp) that is lower in the stack than the drain/source to which it is coupled. On the other hand, the second graph (610) shown in FIG. 6C represents a voltage difference over another a tapping point (Tr) that is also lower in the stack than the drain/source to which it is coupled, but by a different amount than (Tp). Similarly to the behavior for tapping point (Tp), the drain/source is positive with respect to the tapping point (Tr) for the positive swing portion of the RF cycle, while instead there is a part (time window/segment) of the negative swing portion, ΔT4, where the drain/source voltage is negative with respect to the voltage of the tapping point (Tr). Graphs (610) and (620) illustrate that both i) the magnitude of the voltage difference and ii) duration of the drain/source being negative with respect to a coupled tapping point can be adjusted by selecting how much lower or higher in the stack the tapping point is relative to the drain/source to which it is coupled. Since the charge redistribution resistive ladder can have any number of tapping points, this qualitative consideration allows adjustment of the voltage difference waveforms to achieve any desired characteristics.

Turning now to the previous representations shown in FIGS. 4 and 5, the following FIGS. 8A-8E will illustrate several current flow examples. Such figures are intended to be schematic and indicative. For example, the transistors are not shown for added clarity. Additionally, only one drain resistor per transistor is shown, so that each point between resistors on the drain/source resistive ladder is tied to a transistor drain. Similarly, only one body resistor per transistor is shown, so that each point between resistors on the body resistive ladder is tied to a transistor body. Moreover, in the exemplary representation of such figures, the charge redistribution resistive ladder is broken into four segments per transistor, also in this case for representation purposes only. The person skilled in the art will understand that there can be any number of segments on any ladder, evenly distributed throughout the transistors or not. Similarly, the person skilled in the art will also understand that there can be more than one drain and/or body resistor on a respective ladder per transistor, in order to allow freedom in the design of tapping points, in order to provide desired voltage relationships between certain points in the three resistive ladders as a function of applied RF voltage.

With initial reference to FIG. 8A, in order to illustrate the current flow during the time period when the bridge circuits, (BCd, BCb) are in a conducting (ON) state, such figure shows a section (800) of a FET switch stack, showing drain-source resistive ladder (801), body resistive ladder (803) and charge redistribution resistive ladder (802). In such figure the left side is the one intended to be closer to the antenna terminal, as indicated. Several drain/source bridge circuits (BCd) are shown, with their respective anodes (A) and cathodes (C) connected between tapping points in the charge redistribution ladder (802) and drain/source terminals in the drain-source resistive ladder/network (801). Several body bridge circuits (BCb) are also shown, with their respective cathodes (C) and anodes (A) connected between tapping points in the charge redistribution resistive ladder (802) and body terminals in the body resistive ladder (803).

Figure 8B:
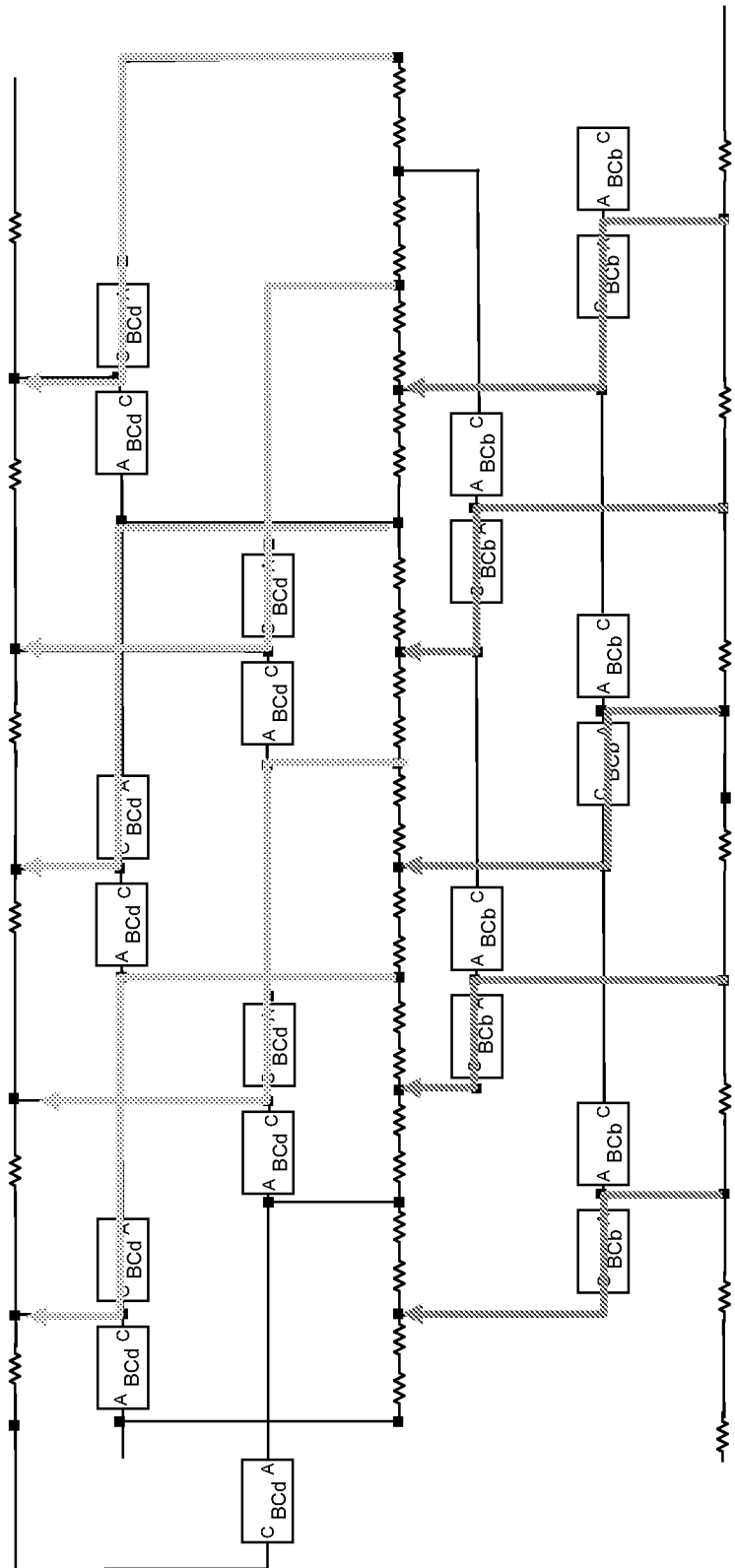

With reference to FIG. 6C, FIG. 8B shows current flow (using thick lines and arrows) during the negative portion of the RF signal applied to the antenna, and in particular during time interval ΔT1 of FIG. 6C. As described previously, the nodes in all three resistive ladders (801, 802, 803) have smaller RF voltage amplitude going towards positions "lower" in the stack, i.e. farther away from the antenna and towards the right direction in FIG. 8B. Thus, during the negative part of the RF voltage signal, the nodes towards the right direction have a smaller negative voltage applied, becoming more positive with respect to points closer to the antenna end. Therefore, the bridge circuits BCd and BCb having cathodes connected closer than anodes to the antenna (on the left in this figure) are configured to conduct during this part of the waveform. As a consequence, current flows from the body resistive ladder to the charge redistribution resistive ladder and from the charge redistribution resistive ladder to the drain-source resistive ladder as indicated by the arrows.

Figure 8C:
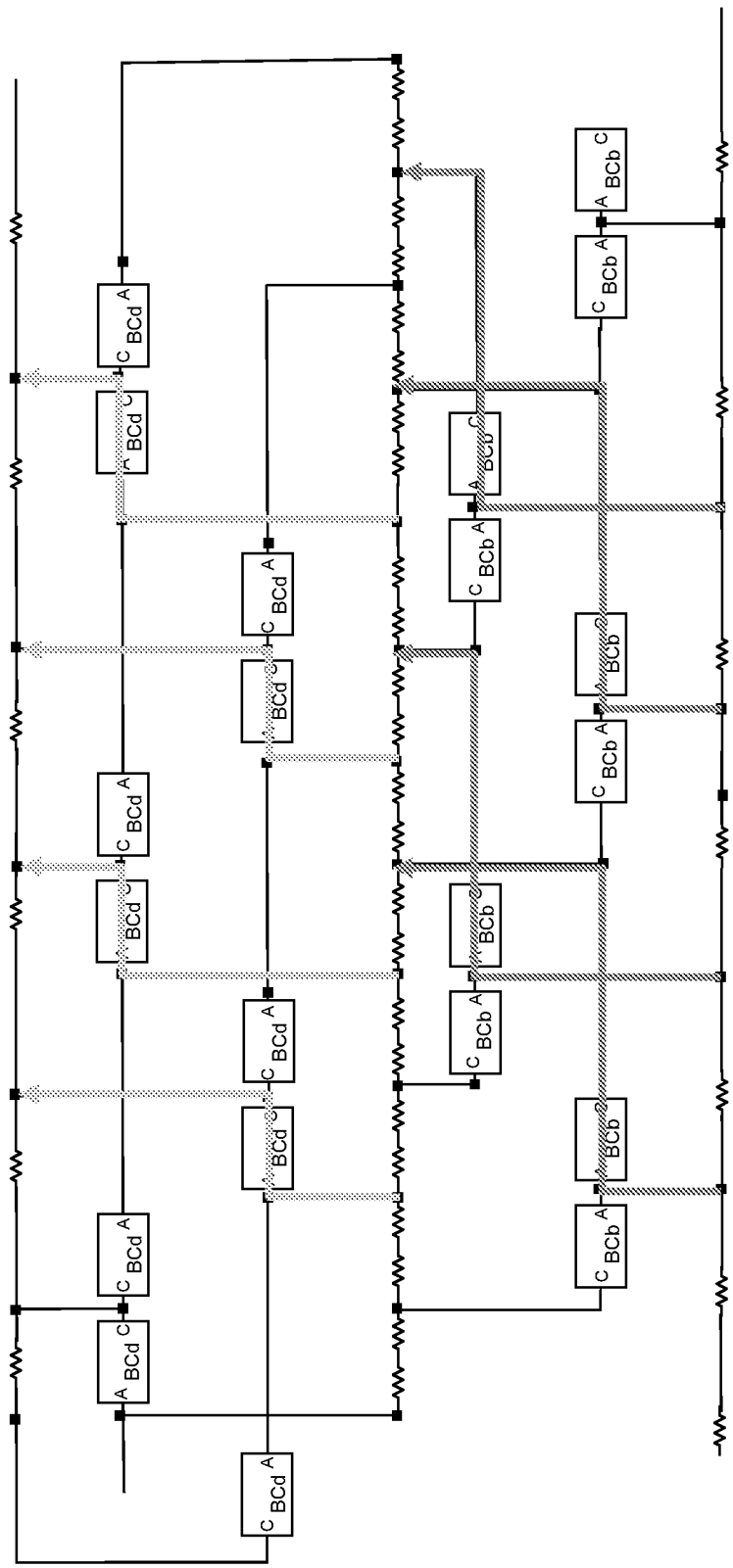

On the other hand, FIG. 8C shows current flow during the positive portion of the RF signal applied to the antenna, and in particular during time interval ΔT2 of FIG. 6D. As described previously, the nodes in all three resistive ladders (801, 802, 803) have larger RF voltage amplitude going towards positions "higher" in the stack, i.e. closer to the antenna and towards the left direction in FIG. 8C. Thus, during the positive part of the RF voltage signal, the nodes towards the left direction have a larger positive voltage applied, becoming positive with respect to points farther from the antenna end. Therefore, the bridge circuits BCd and BCb having anodes connected closer than cathodes to the antenna (on the left in this figure) are configured to conduct during this part of the waveform. As a consequence, current flows from the body resistive ladder to the charge redistribution resistive ladder and from the charge redistribution resistive ladder to the drain-source resistive ladder as indicated by the arrows.

With reference to the combined representation shown in FIGS. 8B and 8C, the points where the current from the body resistive ladder is injected into the charge redistribution ladder are separate from the points in the charge redistribution resistive ladder where current is drawn by the drain resistive ladder. The charge redistribution ladder connects those points and enables net current to flow from the body resistive ladder to the drain resistive ladder. As illustrated in FIG. 6C, the characteristics of the relative voltage waveform between a drain/source and a tapping point coupled to it can be adjusted by changing the position in the stack of the tapping point relative to the drain/source. Thus, if a different tapping point in the charge redistribution resistive ladder is chosen, that will change the magnitude and duration of the portion of the waveform where current is flowing from the charge redistribution resistive ladder to the drain/source resistive ladder. The same is true for a body coupled to the charge redistribution resistive ladder. Since tapping points coupled to a drain/source and tapping points coupled to a body can be adjusted to different points along the charge redistribution resistive ladder, it is also possible to have tapping points coupled to a drain/source be the same as tapping points coupled to a body. However, this choice may restrict the relative voltage waveforms (see FIG. 6C) to non-optimum characteristics.

Figure 8D:
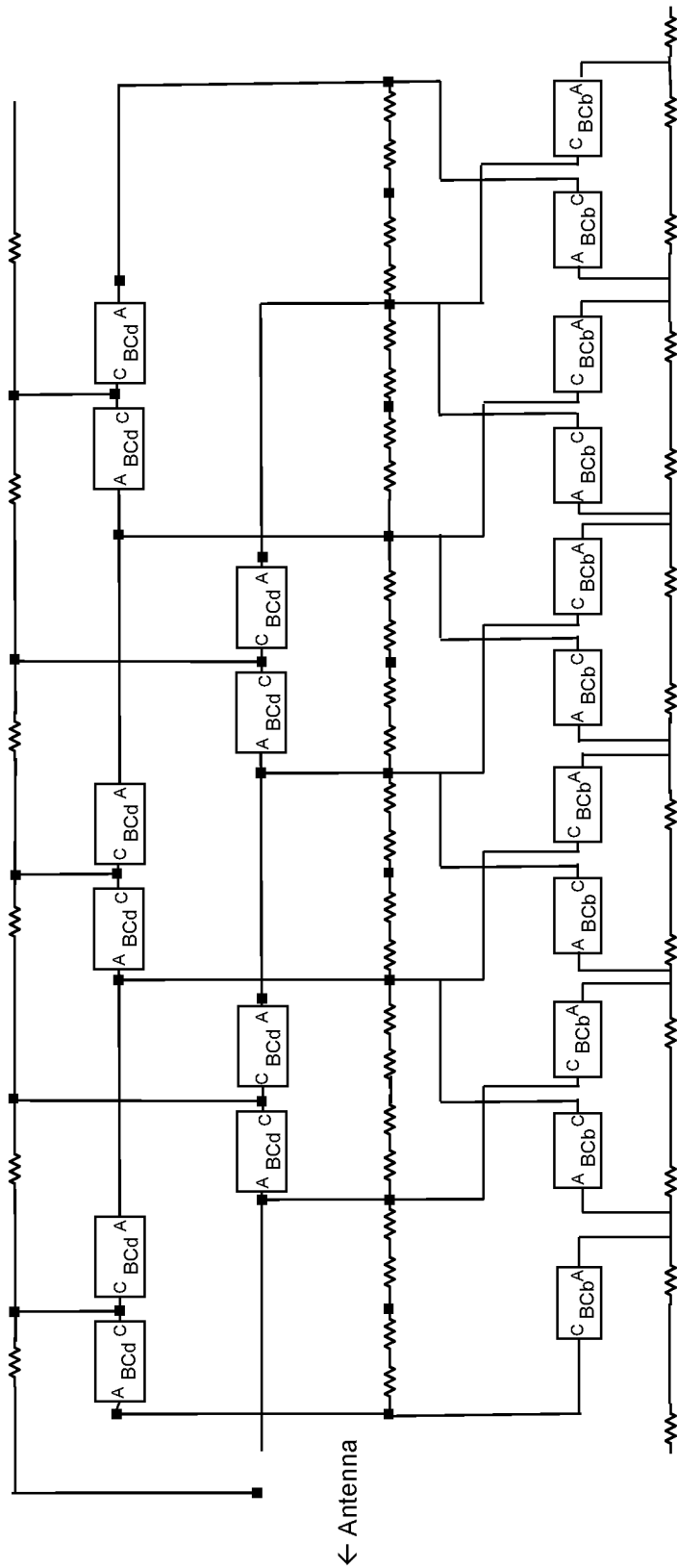

Since the characteristics of a body to tapping point relative voltage waveform is dependent on the position in the stack of the tapping point with reference to the coupled body, this relative position can be changed by moving either the tapping point or the point at which a location in the body resistive ladder is accessed. By dividing a resistor in the body resistive ladder into multiple series resistors, additional access points can be created. By way of example, while FIGS. 8A-8C show one resistor per body in the body resistive ladder, FIG. 8D shows a different embodiment of such configuration where there are two resistive segments (two examples are shown with numerals 803' and 803") per body in the body resistive ladder. Therefore, in FIG. 8D, the points of access to the body resistive ladder are translated by one-half of a stack unit. In order to maintain the same relative position of the charge redistribution resistive ladder to the access of the body resistive ladder, the tapping points on the charge redistribution resistive ladder are also translated by one-half of a stack unit. The resulting configuration provides an embodiment where the same tapping points on the charge redistribution resistive ladder are coupled to both the drain/source resistive ladder and the body resistive ladder.

Figure 8E:
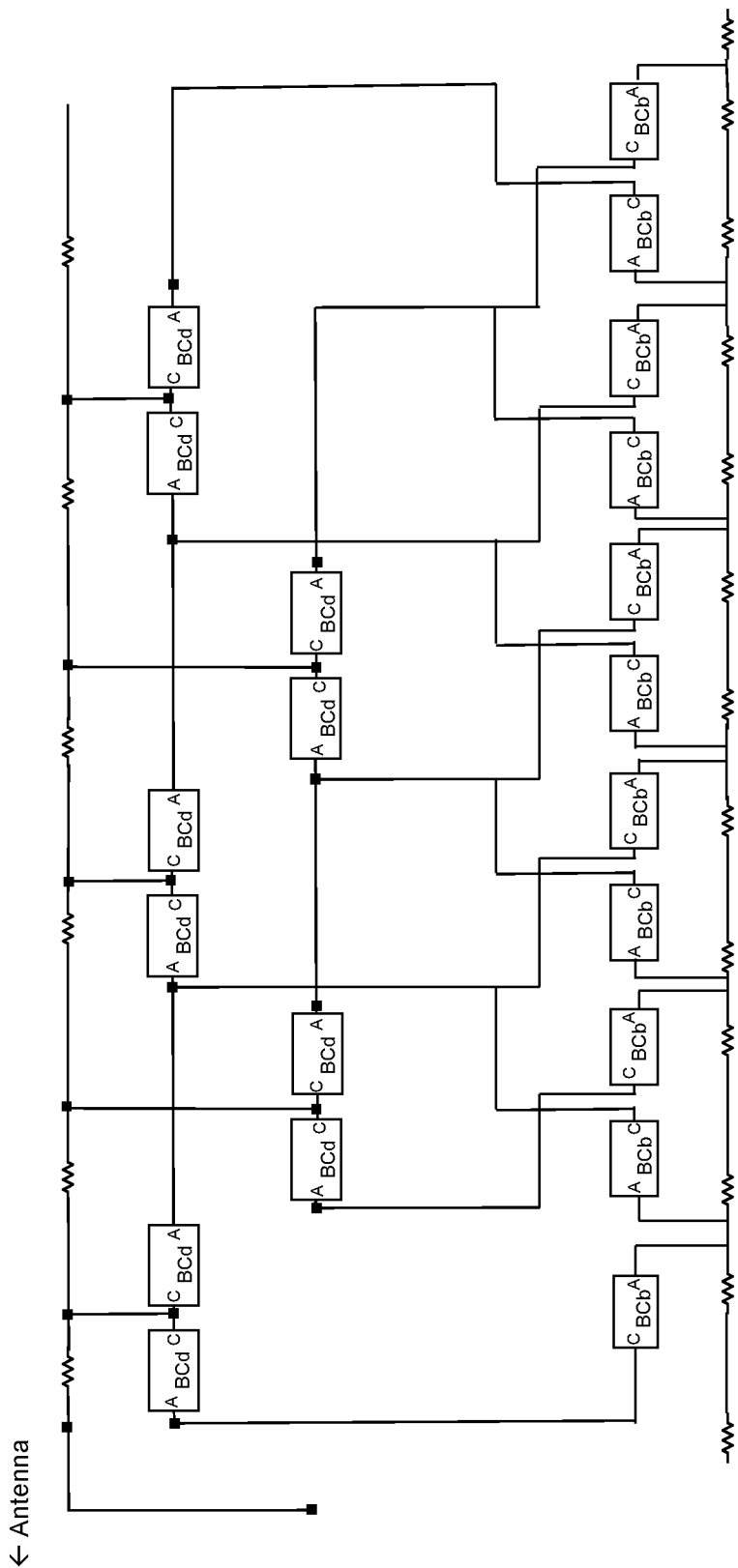

For the above noted specific case where the same charge redistribution resistive ladder tapping points are coupled to both the drain resistive ladder and the body resistive ladder, current can flow from the body resistive ladder to the drain resistive ladder without passing through any resistors in the charge redistribution resistive ladder. In this case, the charge redistribution resistive ladder does not need to have resistors connecting the tapping points that are common to the body resistive ladder access points and the drain resistive ladder access points. Such specific configuration is shown in FIG. 8E, where all the resistors in the charge redistribution network have been removed and the charge redistribution resistive ladder has been thus omitted. In such case, charge redistribution between the drain/source resistive ladder and the body resistive ladder occurs directly, not just as a consequence induced through the presence of the charge redistribution resistive network. Similarly to the other embodiments, during each half cycle, current will only flow through specific bridge circuits. As drawn, during the positive half-cycle on the RF antenna signal, current will only flow through bridge circuits with anodes oriented to the left/antenna side. During the negative half-cycle, current will only flow through bridge circuits with cathodes on the left/antenna, side.

Figure 8F:
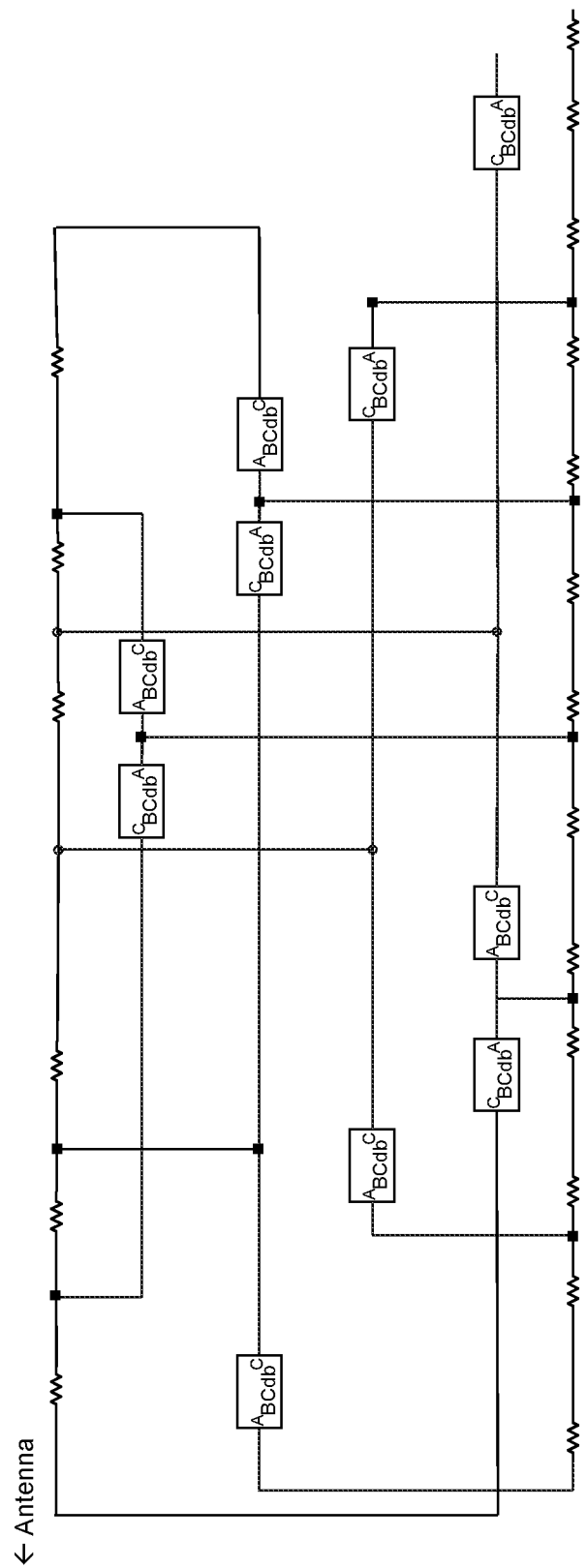
Figure 8G:
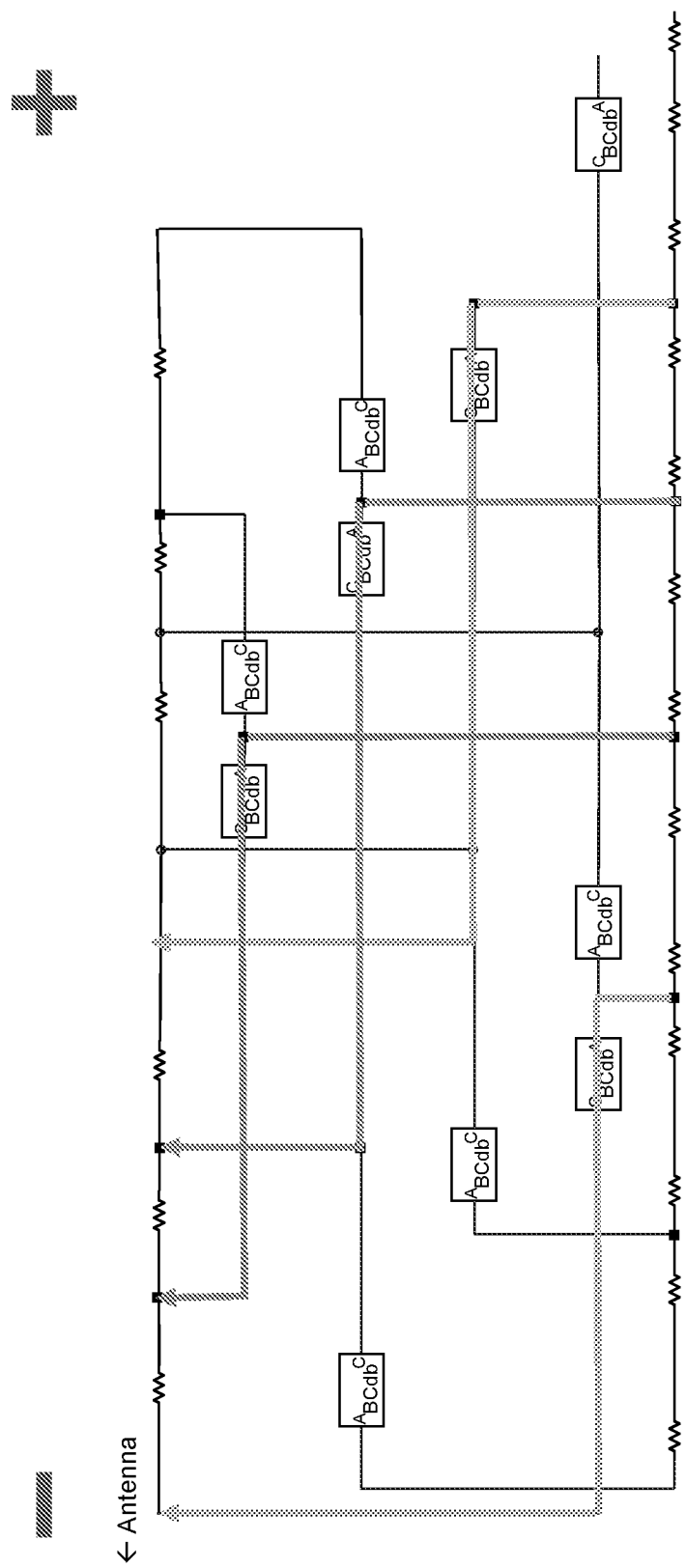
Figure 8H:
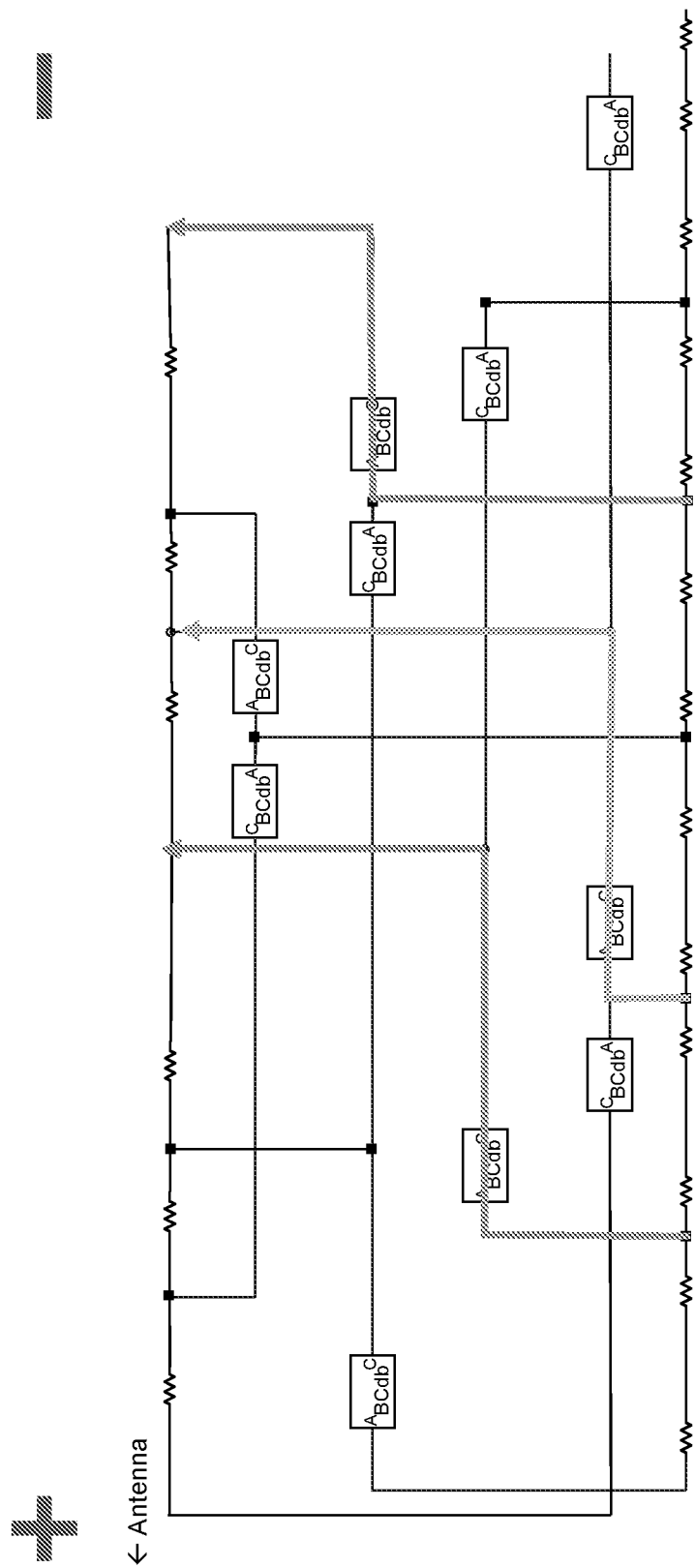

Thus, in FIG. 8E, body bridge circuits (BCb) that are connected to drain bridge circuits (BCd) with the same anode/cathode orientation can be grouped and referred to as drain-body bridge circuits (BCdb). This combining of the body bridge circuits (BCb) with the drain bridge circuits (BCd) to form body-drain bridge circuits (BCdb) is shown in FIG. 8F. Similarly to the case when the bridge circuits are separate, during the positive half-cycle on the RF antenna signal, current will only flow through bridge circuits with the anode oriented to the left/antenna, side, as shown in FIG. 8H. On the other hand, during the negative half-cycle of the RF antenna signal, current will only flow through bridge circuits with the cathode on the left, or antenna, side, as shown in FIG. 8G.

In view of the above, the person skilled in the art will appreciate that the teachings of the present disclosure provide solutions both to the distribution and generation issues associated with the previously described body leakage current issue.

As already noted in several portions of the present disclosure, the bridge circuits connect drain/source tapping points to drain/source terminals of corresponding transistors such that i) during the time when the voltage of a drain/source tapping point is higher than the voltage of the drain/source terminal of a corresponding transistor, the bridge circuit connecting the drain/source tapping point and drain/source terminal is in an ON state and therefore conducting, and ii) during the time when the voltage of the drain/source tapping point is lower than the voltage of the drain/source terminal of the corresponding transistor, the bridge circuit connecting the drain/source tapping point and drain/source terminal is in an OFF state and therefore not conducting.

Similarly, the bridge circuits connect body tapping points to body terminals of corresponding transistors such that i) during the time when the voltage of a body tapping point is lower than the voltage of the body terminal of a corresponding transistor, the bridge circuit connecting the body tapping point and body terminal is in an ON state and therefore conducting, and ii) during the time when the voltage of the body tapping point is higher than the voltage of the body terminal of the corresponding transistor, the bridge circuit connecting the body tapping point and body terminal is in an OFF state and therefore not conducting.

In other words, the function of the bridge circuit(s) is to conduct current when their anode is sufficiently positive with respect to their cathode and block current flow when the anode is less positive or negative with respect to their cathode. A bridge circuit may be a two-terminal device or circuit block connecting a tapping point in the charge redistribution ladder to a drain/source or a body terminal of a transistor or connecting a point in a drain/source ladder to a point in a body ladder. Additionally, the bridge circuit may have additional control terminals connecting to additional points in the charge redistribution ladder. Elements within the bridge circuit may include diodes, diode-connected NMOS transistors, diode-connected PMOS transistors, resistors, NMOS transistors utilizing additional control terminal of the bridge circuit and PMOS transistors utilizing additional control terminal of the bridge circuit. Any combination of the above-mentioned exemplary implementations of the bridge circuits may be placed in series, parallel or series/parallel combination.

Figure 9A:
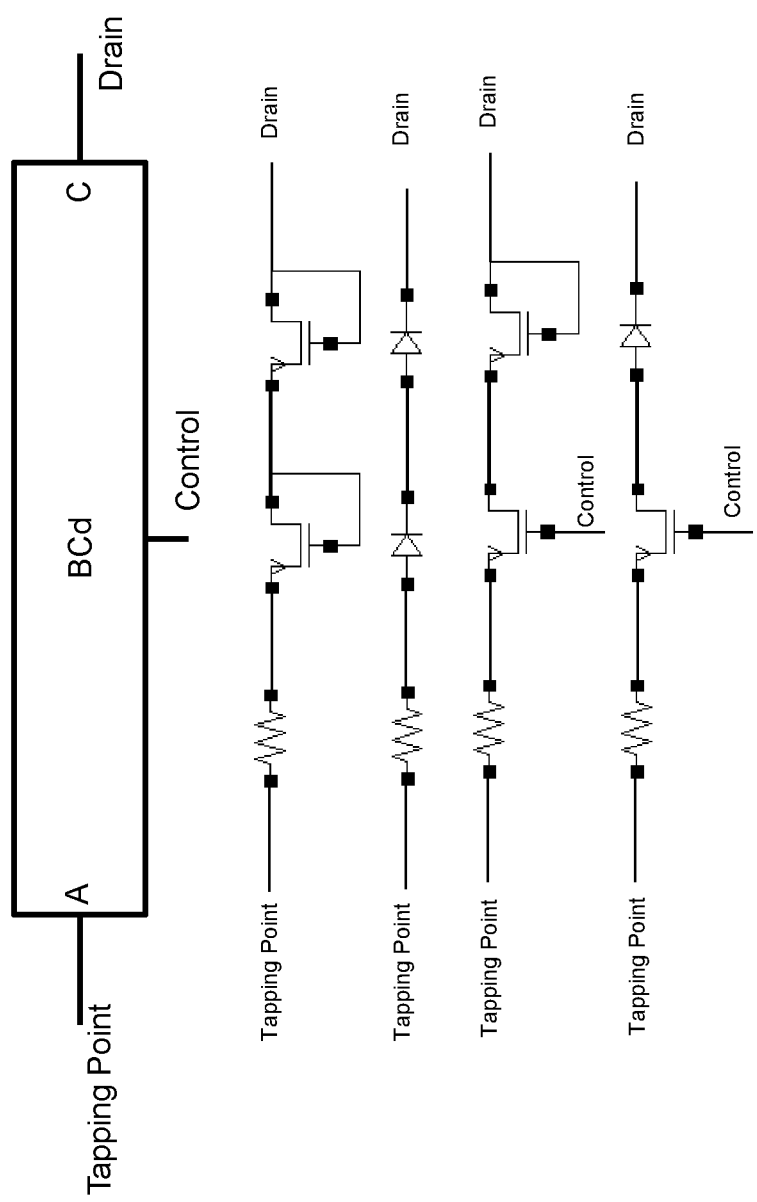
FIG. 9A shows an exemplary implementation of a drain bridge circuit according to embodiments of the present disclosure.

FIG. 9A shows exemplary implementations of a drain bridge circuit with an anode node connected to a charge redistribution ladder tapping point, a cathode node connected to transistor drain/source and optional control port, which can connect to a different tapping point in the charge redistribution ladder or to some other input signal. The person skilled in the art will understand that these are a few examples of implementations and other implementations in accordance with the teachings of present disclosure and using various combinations of such implementations may also be envisaged.

Figure 9B:
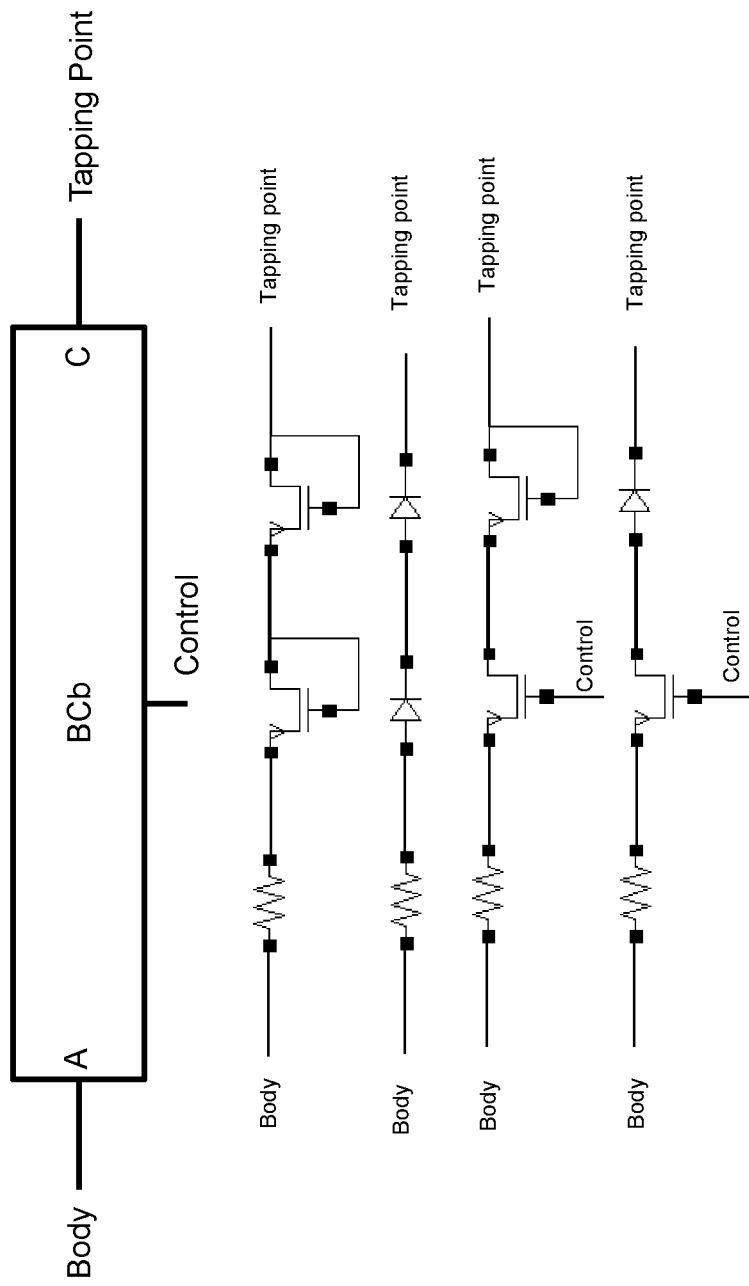
FIG. 9B shows an exemplary implementation of a body bridge circuit according to embodiments of the present disclosure.

FIG. 9B shows an exemplary body bridge circuit with a cathode node connected to a charge redistribution ladder tapping point, an anode node connected to transistor body and optional control port, which can connect to a different tapping point in the charge redistribution ladder or to some other input signal. The person skilled in the art will understand that these are a few examples of implementations and other implementations in accordance with the teachings of present disclosure and using various combinations of such implementations may also be envisaged Referring back to FIG. 6C, graph (610) represents a smaller negative peak voltage across the bridge circuit in the OFF state. This may represent a preferred scenario over the one represented by graph (620) in terms of the breakdown voltage requirements of the transistor stacks used as part of the design of the bridge circuit shown in FIG. 9A or 9B.

In the above description, the relative voltages of the drains of transistors (Tk) and corresponding tapping points of the redistribution resistive ladder may be selected in a way to ensure a proper transfer of charge to the drain/source terminals. Similarly, the relative voltages of the bodies of transistors (Tk) and corresponding tapping points of the redistribution resistive ladder are selected to ensure a proper transfer of charge from the body terminals. Therefore, the voltages of the terminals of the transistors (Tk) and the tapping points should have a known, consistent relationship.

With reference to FIG. 3, the switching circuit (301) may be configured to divide the full RF signal applied to the antenna among the plurality of transistors (T1, . . . , Tn) connected in series, among the plurality of resistors connected in series in the drain-source resistive ladder, among the plurality of resistors connected in series in the gate resistive ladder, and among the plurality of resistors connected in series in the body resistive ladder. Since each resistor in the drain-source resistor ladder is connected in parallel with the drain and source terminals of an associated transistor, any discussion of connections referring to either of them applies to both of them.

With further reference to FIG. 3, the charge redistribution resistive ladder (302) may be configured to divide the full RF signal applied to the antenna among the plurality of resistors connected in series.

The full RF signal may be divided in equal or unequal steps in all of the above series connected structures. Further, the division of the RF signal within each of the series connected structures may change as a function of operating conditions of other circuit blocks. Since the operation of the charge redistribution resistive ladder benefits of a precise voltage relationship to the points where it connects to the drain-source resistive ladder, it is preferred that the RF signal division within the redistribution resistive ladder follows the changes in the RF signal division within the drain-source resistive ladder. In other words, as the RF signal division within the series transistor stack changes, the RF signal division within the redistribution resistive ladder may be synchronized with these changes.

In order to maintain such synchronization, the redistribution resistive ladder may have specific tapping points designed to have the same RF signal division as the drain-source resistive ladder under nominal conditions. This condition can be satisfied by providing, for example, a capacitor of suitable size connecting each point of the drain-source resistive ladder to the specific tapping points of the redistribution resistive ladder configured to have the same RF signal division of the drain-source resistive ladder, see, e.g., capacitor (510) shown in FIG. 5. As the RF signal division in the switching circuit changes due to factors described above, the RF signal division in the redistribution resistive ladder will follow due to the capacitive connection between the drain-source resistive ladder and the specific tap points of the redistribution resistive ladder.

In the embodiments described so far, a single charge redistribution resistive ladder is used to provide tapping points to be coupled to drain/source and body terminals of transistors within the FET switch stack. Embodiments in accordance with the present disclosure may also be envisaged wherein two separate charge redistribution resistive ladders are used. In such embodiments, a drain charge redistribution resistive ladder may be used to provide tapping points to be coupled to the drain/source terminals, and a body charge redistribution resistive ladder may be used to provide tapping points to be coupled to the body terminals of corresponding transistors within the FET switch stack. In such embodiments, an additional number of nodes or tapping points can be designed, given that one of the two redistribution ladders will contain only drain/source tapping points and the other will contain only body tapping points. In what follows, such embodiments using two charge redistribution resistive ladders are described in more detail.

Figure 10:
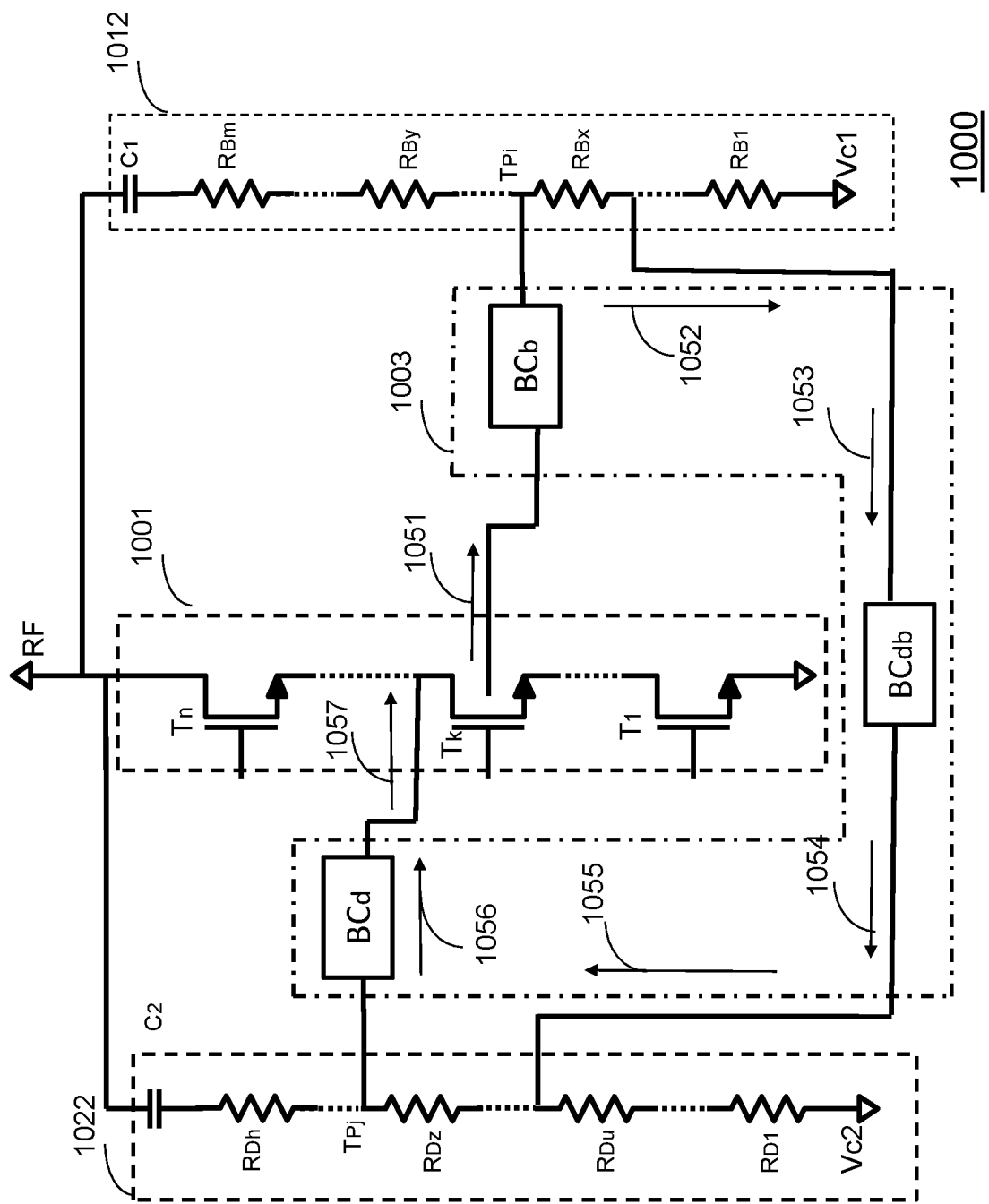
FIG. 10 shows a FET switch stack including two charge redistribution resistive ladders in accordance with embodiments of the present disclosure

FIG. 10 shows a FET switch stack circuit (1000) according to embodiments of the present disclosure. The FET switch stack circuit (1000) comprises a switching circuit (1001), a body charge redistribution resistive ladder (1012), a drain charge redistribution resistive ladder (1022), and a bridge network (1003). The switching circuit (1001) may be similar to the switching circuit (301) of FIG. 3. For ease of understanding, only three stacked transistors are shown in FIG. 10. Additionally, while the bridge network (1003) may comprise more than three bridge circuits, for the sake of clarity and for illustration purposes, only three such circuits are shown in FIG. 10, i.e. drain bridge circuit (BCd), body bridge circuit (BCb) and drain-body bridge circuit (BCdb). The body charge redistribution ladder (1012) is coupled at one end to the antenna (RF path) and connected to reference voltage (Vc1) at another end. Similarly, the drain charge redistribution ladder (1022) is coupled at one end to the antenna (RF path) and connected to reference voltage (Vc2) at another end.

With continued reference to FIG. 10, body bridge circuit (BCb) is used to couple/decouple tapping points of the body charge redistribution ladder (1012) to/from the body terminals of corresponding transistors, and drain bridge circuit (BCd) is used to couple/decouple tapping points of the drain charge redistribution ladder (1022) to/from the drain/source terminals of corresponding transistors in the switching circuit (1001). However, in order to conserve current, drain-body bridge circuit (BCdb) may also be used to couple/decouple body and drain charge redistribution ladders (1012, 1022). The principle of operation of each of the bridge circuits shown in FIG. 10 is similar to what was described before with regards to bridge circuits (BCb, BCd) of FIG. 5 and bridge circuits (BCdb) of FIG. 8E. In particular, a drain-body bridge circuit (BCdb) like the one shown on the bottom of FIG. 10 couples directly tapping point (Tpi) on the body charge redistribution ladder (1012) with tapping point (Tpj) on the drain charge redistribution ladder (1022), thus redistributing charges between one ladder and the other.

Still with reference to FIG. 10, the path of the charge transfer is as shown by arrows (1051, 1052, . . . , 1057). In other words, charge is transferred from the body to the body bridge circuit (arrow 1051), and then to the drain bridge circuit via the drain-body bridge circuit (arrows 1052, 1053, 1054, 1055), and then to the drain/source terminal (arrows 1056, 1057). In view of this, the body leakage current, Ibody, is supplied and circulated locally within the circuit structure.

Turning to the capacitive synchronization implemented with reference to the single charge redistribution ladder mentioned before, such synchronization can be extended to the embodiment of FIG. 10, if desired, by connecting capacitors between specific tap points of each resistive redistribution ladder.

Switch stacks designed in accordance with embodiments of the present disclosure may be implemented as part of an integrated circuit chip or an electronic module, wherein the integrated circuit chip or the electronic module are part of a communication device. Further embodiments according to the present disclosure may also be envisaged, wherein the switch stacks as disclosed is part of the RF front-end of an electronic circuit or an electronic module or a communication device.

With further reference to FIGS. 3-10, and in accordance with further embodiments of the present disclosure:

The FET switch stack circuit (300) of FIG. 3 may include two or more transistors.

Bridge circuits with the same or different constituents or a combination thereof may be employed to design switch stacks.

Reference voltages (Vb, Vg) may supply negative voltages when the stack of FETs is in the OFF state.

Reference voltages (Vb, Vg) may supply the same or different voltage values.

Reference voltages (Vb, Vg) may be controlled by one or more bias control circuits to provide proper voltage values during the OFF and ON states of the FET switch stack.

Reference voltage Vt may be ground.

Any tapping point of the charge redistribution ladder (302) of FIG. 3 paired with a drain/source terminal of a first transistor, may also be paired with a body terminal of a second transistor other than the first transistor.

A charge redistribution resistive ladder may comprise one or more tapping points.

The reference voltage (Vc) may supply a voltage value that is half of the voltage value supplied by the reference voltage (Vb) or the reference voltage (Vg). By way of example, and not of limitation, reference voltages (Vb, Vg) may each supply −3.2V and Vc may be halfway at −1.6V.

The reference voltage (Vc1) may supply a voltage value that is around ⅔ of the voltage value supplied by the reference voltages (Vb) or (Vg) while the reference voltage (Vc2) may supply a voltage value at ⅓ of the voltage supplied by the reference voltages (Vb) or (Vg). By way of example, and not of limitation, reference voltages (Vb, Vg) may each supply −3.3V, and the reference voltages (Vc1, Vc2) may supply (−2.2V, −1.1V) respectively.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A field effect transistor (FET) switch stack circuit comprising:
   i) a stacked configuration of series-connected FET transistors;
   ii) a drain/source charge redistribution resistive ladder comprising series-connected drain/source charge redistribution resistors and a set of one or more drain/source tapping points in correspondence with drains or sources of FET transistors of the series-connected FET transistors;
   iii) a body charge redistribution resistive ladder comprising series-connected body charge redistribution resistors and a set of one or more body tapping points in correspondence with bodies of FET transistors of the series-connected FET transistors; and
   iv) a drain-body bridge network configured to selectively couple/decouple the set of one or more drain/source tapping points with/from the set of one or more body tapping points, thus selectively coupling/decoupling drains or sources of the FET transistors with/from bodies of the FET transistors to redistribute charges throughout the FET transistors, and
   wherein:
      each body charge redistribution resistor has a first end and a second end, and, regardless of a state of the FET switch stack,
      the first end is connected to a body terminal of a first FET transistor and
      the second end is connected to a body terminal of a second FET transistor, the first and the second FET transistors being adjacent FET transistors.

2. The FET switch stack circuit of claim 1, wherein the drain-body bridge network comprises at least one drain-body bridge circuit.

3. The FET switch stack circuit of claim 2, wherein each drain-body bridge circuit is a combination of a drain/source bridge circuit and a body bridge circuit, the drain/source bridge circuit connected between the drain/source charge redistribution resistive ladder and the body bridge circuit, the body bridge circuit connected between the drain/source bridge circuit and the body charge redistribution resistive ladder.

4. The FET switch stack circuit of claim 3, wherein:
   the series-connected FET transistors are coupled to a radio frequency (RF) terminal;
   the drain/source charge redistribution ladder is coupled to the RF terminal; and
   the body charge redistribution ladder is coupled at one end to the RF terminal.

5. The FET switch stack circuit of claim 4, wherein when the FET switch stack is in an OFF state:
the FET switch is configured to be coupled to an RF signal at the RF terminal, and to couple RF voltages at source/drain tapping points of the set of one or more drain/source tapping points and at body tapping points of the set of one or more body tapping points; and
the drain-body bridge circuits are configured to couple the body tapping points to the drain/source tapping points during a first portion of a period of the RF signal.

6. The FET switch stack circuit of claim 5, wherein, when the FET switch stack is in the OFF state, the drain-body bridge circuits are configured to decouple the body tapping points from the drain/source tapping points during a second portion of the period of the RF signal separate from the first portion.

7. A radio frequency (RF) switch stack circuit comprising:
a stack of FET transistors connected in a series configuration and configured to be coupled to an antenna to receive an RF signal;
a body resistive ladder comprising body resistors coupled to bodies of FET transistors of the stack of FET transistors;
a drain-source resistive ladder comprising drain-source resistors coupled to drain/sources of FET transistors of the stack of FET transistors;
a charge redistribution resistive ladder comprising charge transfer resistors and at least one tapping point; and
a bridge network configured to selectively couple/decouple the at least one tapping point of the charge redistribution resistive ladder with/from the drain-sources and/or bodies of the transistors of the stack of transistors during a portion of a period of the RF signal in order to selectively source current from the charge redistribution resistive ladder and deliver said current to the drain-source resistive ladder and/or sink current from the body resistive ladder and deliver said current to the charge redistribution resistive ladder; and
wherein:
each body resistor has a first end and a second end, and, regardless of a state of the FET switch stack,
the first end is connected to a body terminal of a first FET transistor and
the second end is connected to a body terminal of a second FET transistor, the first and the second FET transistors being adjacent FET transistors.

8. The RF switch stack circuit of claim 7, wherein the bridge network comprises at least one drain-source bridge circuit and at least one body bridge circuit, each drain-source bridge circuit configured to selectively couple a tapping point of the charge redistribution resistive ladder with a node on the drain-source resistive ladder, each body bridge circuit configured to selectively couple a tapping point of the charge redistribution resistive ladder with a node of the body resistive ladder, each drain-source bridge circuit and body bridge circuit selectively configured to be in a conductive state to enable selective coupling or a non-conductive state to disable selective coupling during different portions of the period of the RF signal.

9. The RF switch stack circuit of claim 8, wherein selective coupling of the tapping point to the node of the drain-source resistive ladder is a function of a voltage difference between the tapping point and the node on the drain-source resistive ladder, and selective coupling of the tapping point to the node on the body resistive ladder is a function of the voltage difference between the tapping point and the node on the body resistive ladder.

10. The RF switch stack circuit of claim 7, further comprising a capacitor configured to be coupled between the antenna and the charge redistribution resistive ladder.

11. The RF switch stack circuit of claim 7, wherein tapping points of the at least one tapping point are capacitively connected to the nodes on the drain-source resistive ladder and/or the nodes on the body resistive ladder.

12. The RF switch stack circuit of claim 7, wherein the charge redistribution resistive ladder comprises a first charge redistribution ladder with at least one first tapping point connectable to drain-sources of transistors of the stack of transistors through the bridge network and a second charge redistribution ladder with at least one second tapping point connectable to bodies of transistors of the stack of transistors through the bridge network.

13. The RF switch stack circuit of claim 12, wherein tapping points of the at least one first tapping point are capacitively connected to the nodes of the drain-source resistive ladder and tapping points of the at least one second tapping point are capacitively connected to the nodes of the body resistive ladder.

14. A communication system comprising the RF switch stack circuit of claim 7.

15. A radio frequency (RF) switch stack circuit comprising:
a stack of FET transistors connected in a series configuration and configured to be coupled to an antenna to receive an RF signal;
a body resistive ladder comprising body resistors coupled to bodies of FET transistors of the stack of FET transistors;
a drain-source resistive ladder comprising drain-source resistors coupled to drain/sources of FET transistors of the stack of FET transistors;
a charge redistribution resistive ladder comprising charge transfer resistors and at least one tapping point; and
a bridge network configured to selectively couple/decouple the at least one tapping point of the charge redistribution resistive ladder with/from the drain-sources and/or bodies of the transistors of the stack of transistors during a portion of a period of the RF signal in order to selectively source current from the charge redistribution resistive ladder and deliver said current to the drain-source resistive ladder and/or sink current from the body resistive ladder and deliver said current to the charge redistribution resistive ladder, and
wherein:
the bridge network comprises at least one drain-source bridge circuit and at least one body bridge circuit, each drain-source bridge circuit configured to selectively couple a tapping point of the charge redistribution resistive ladder with a node on the drain-source resistive ladder, each body bridge circuit configured to selectively couple a tapping point of the charge redistribution resistive ladder with a node of the body resistive ladder, each drain-source bridge circuit and body bridge circuit selectively configured to be in a conductive state to enable selective coupling or a non-conductive state to disable selective coupling during different portions of the period of the RF signal.

16. The RF switch stack circuit of claim 15, wherein selective coupling of the tapping point to the node of the drain-source resistive ladder is a function of a voltage difference between the tapping point and the node on the drain-source resistive ladder, and selective coupling of the tapping point to the node on the body resistive ladder is a function of the voltage difference between the tapping point and the node on the body resistive ladder.

17. The RF switch stack circuit of claim 15, further comprising a capacitor configured to be coupled between the antenna and the charge redistribution resistive ladder.

18. The RF switch stack circuit of claim 15, wherein tapping points of the at least one tapping point are capacitively connected to the nodes on the drain-source resistive ladder and/or the nodes on the body resistive ladder.

19. A radio frequency (RF) switch stack circuit comprising:
- a stack of FET transistors connected in a series configuration and configured to be coupled to an antenna to receive an RF signal;
- a body resistive ladder comprising body resistors coupled to bodies of FET transistors of the stack of FET transistors;
- a drain-source resistive ladder comprising drain-source resistors coupled to drain/sources of FET transistors of the stack of FET transistors;
- a charge redistribution resistive ladder comprising charge transfer resistors and at least one tapping point; and
- a bridge network configured to selectively couple/decouple the at least one tapping point of the charge redistribution resistive ladder with/from the drain-sources and/or bodies of the transistors of the stack of transistors during a portion of a period of the RF signal in order to selectively source current from the charge redistribution resistive ladder and deliver said current to the drain-source resistive ladder and/or sink current from the body resistive ladder and deliver said current to the charge redistribution resistive ladder; and wherein:
- the charge redistribution resistive ladder comprises a first charge redistribution ladder with at least one first tapping point connectable to drain-sources of transistors of the stack of transistors through the bridge network and a second charge redistribution ladder with at least one second tapping point connectable to bodies of transistors of the stack of transistors through the bridge network.

20. The RF switch stack circuit of claim 19, wherein tapping points of the at least one first tapping point are capacitively connected to the nodes of the drain-source resistive ladder and tapping points of the at least one second tapping point are capacitively connected to the nodes of the body resistive ladder.

21. A communication system comprising the RF switch stack circuit of claim 15.

* * * * *